United States Patent
Liu et al.

(10) Patent No.: US 10,948,423 B2
(45) Date of Patent: Mar. 16, 2021

(54) SENSITIVE PARTICLE DETECTION WITH SPATIALLY-VARYING POLARIZATION ROTATOR AND POLARIZER

(71) Applicant: KLA Corporation, Milpitas, CA (US)

(72) Inventors: Xuefeng Liu, San Jose, CA (US); Jenn-Kuen Leong, San Jose, CA (US); Daniel Kavaldjiev, San Jose, CA (US); John Fielden, Los Altos, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/577,326

(22) Filed: Sep. 20, 2019

(65) Prior Publication Data
US 2020/0264109 A1    Aug. 20, 2020

Related U.S. Application Data

(60) Provisional application No. 62/806,820, filed on Feb. 17, 2019.

(51) Int. Cl.
*G01N 21/95*    (2006.01)
*H01L 21/66*    (2006.01)
(Continued)

(52) U.S. Cl.
CPC ......... *G01N 21/9501* (2013.01); *G01N 21/21* (2013.01); *G01N 21/956* (2013.01); *H01L 22/12* (2013.01); *G01N 2021/8822* (2013.01)

(58) Field of Classification Search
CPC ............. G01N 21/9501; G01N 21/956; G01N 21/9563; G01N 21/21; G01N 21/95607;
(Continued)

(56) References Cited

U.S. PATENT DOCUMENTS

| 3,758,201 A | 9/1973 | MacNeille |
| 5,414,510 A | 5/1995 | Schultz et al. |

(Continued)

FOREIGN PATENT DOCUMENTS

| JP | 2000155099 A | 6/2000 |
| JP | 2010192914 A | 9/2010 |

(Continued)

OTHER PUBLICATIONS

International Search Report dated Jun. 5, 2020 for PCT/US017395.
(Continued)

*Primary Examiner* — Christina A Riddle
(74) *Attorney, Agent, or Firm* — Suiter Swantz pc llo

(57) ABSTRACT

A dark-field inspection system may include an illumination source to generate an illumination beam, illumination optics configured to direct the illumination beam to a sample at an off-axis angle along an illumination direction, collection optics to collect scattered light from the sample in response to the illumination beam in a dark-field mode, a polarization rotator located at a pupil plane of the one or more collection optics, where the polarization rotator provides a spatially-varying polarization rotation angle selected to rotate light scattered from a surface of the sample to a selected polarization angle, a polarizer aligned to reject light polarized along the selected polarization angle to reject the light scattered from a surface of the sample, and a detector to generate a dark-field image of the sample based on scattered light from the sample passed by the polarizer.

31 Claims, 18 Drawing Sheets

(51) Int. Cl.
*G01N 21/21* (2006.01)
*G01N 21/956* (2006.01)
*G01N 21/88* (2006.01)

(58) Field of Classification Search
CPC .......... G01N 21/8806; G01N 2021/882; H01L 22/12; G01B 11/30; G01B 11/303; G01B 11/306; G02F 2202/40; G02F 1/0136; G02F 1/0311; G02B 5/3008; G02B 5/3083; G02B 5/3025; G02B 27/28; G02B 27/281; G02B 27/283; G02B 27/286; G02B 27/288; G02B 27/50; G02B 27/52; G02B 21/06; G02B 21/10; G02B 21/125; G02B 21/14; G02B 21/0016; G02B 21/0052; G02B 21/0056; G02B 21/0068; G02B 21/0092; G02B 21/361; G02B 26/06
USPC ................ 356/429, 430, 600–613, 364–370, 356/335–336, 237.1–237.6; 359/489.01–489.13, 492.01, 490.01, 359/490.02, 494.01
See application file for complete search history.

(56) References Cited

U.S. PATENT DOCUMENTS

| | | | |
|---|---|---|---|
| 5,426,506 A | 6/1995 | Ellingson et al. | |
| 5,635,829 A | 6/1997 | Hamada | |
| 5,740,147 A | 4/1998 | Kase et al. | |
| 6,034,776 A | 3/2000 | Germer et al. | |
| 6,072,628 A | 6/2000 | Sarayeddine | |
| 6,320,699 B1 | 11/2001 | Maeda et al. | |
| 7,728,965 B2 | 6/2010 | Haller et al. | |
| 8,259,393 B2 * | 9/2012 | Fiolka | G02B 27/286 359/489.15 |
| 8,891,079 B2 | 11/2014 | Zhao et al. | |
| 9,291,575 B2 | 3/2016 | Zhao et al. | |
| 9,891,177 B2 | 2/2018 | Vazhaeparambil et al. | |
| 9,995,850 B2 | 6/2018 | Maleev et al. | |
| 2001/0012154 A1 | 8/2001 | Schuster | |
| 2002/0191288 A1 | 12/2002 | Gruner et al. | |
| 2004/0092045 A1 | 5/2004 | Bultman et al. | |
| 2004/0125373 A1 | 7/2004 | Oldenbourg et al. | |
| 2004/0145734 A1 | 7/2004 | Shibata et al. | |
| 2006/0065820 A1 | 3/2006 | Nagai | |
| 2006/0072807 A1 | 4/2006 | Bultman et al. | |
| 2006/0092398 A1 | 5/2006 | McCarthy | |
| 2006/0203214 A1 | 9/2006 | Shiraishi | |
| 2006/0262236 A1 | 11/2006 | Abileah | |
| 2007/0008511 A1 * | 1/2007 | De Boeij | G03F 7/70125 355/71 |
| 2007/0014504 A1 * | 1/2007 | Fiolka | G02B 27/286 385/11 |
| 2008/0007726 A1 | 1/2008 | Fairley et al. | |
| 2008/0144023 A1 | 6/2008 | Shibata et al. | |
| 2008/0198456 A1 | 8/2008 | Sharp | |
| 2009/0015761 A1 | 1/2009 | Stockham | |
| 2009/0059216 A1 * | 3/2009 | Shibata | G01N 21/956 356/237.4 |
| 2009/0115989 A1 | 5/2009 | Tanaka | |
| 2009/0296066 A1 | 12/2009 | Fiolka | |
| 2010/0045957 A1 | 2/2010 | Fiolka et al. | |
| 2010/0118288 A1 | 5/2010 | Van De Kerkhof et al. | |
| 2010/0177293 A1 | 7/2010 | Fiolka et al. | |
| 2011/0007316 A1 | 1/2011 | De Wit et al. | |
| 2011/0228247 A1 | 9/2011 | Mulder et al. | |
| 2012/0092669 A1 | 4/2012 | Fiolka et al. | |
| 2012/0274931 A1 * | 11/2012 | Otani | G01N 21/21 356/237.3 |
| 2013/0039460 A1 | 2/2013 | Levy et al. | |
| 2014/0361152 A1 * | 12/2014 | Maleev | G01N 21/9501 250/225 |
| 2015/0054941 A1 | 2/2015 | Ogawa | |
| 2015/0276623 A1 * | 10/2015 | Urano | G01N 21/956 356/369 |
| 2016/0018340 A1 | 1/2016 | Otani et al. | |
| 2016/0301914 A1 | 10/2016 | Shechtman et al. | |
| 2017/0082425 A1 | 3/2017 | Minekawa et al. | |
| 2017/0276613 A1 | 9/2017 | Liu et al. | |
| 2017/0363547 A1 | 12/2017 | Otani et al. | |
| 2018/0188188 A1 | 7/2018 | Zhao et al. | |
| 2018/0292574 A1 | 10/2018 | Maleev et al. | |

FOREIGN PATENT DOCUMENTS

| | | |
|---|---|---|
| KR | 20180045817 A | 5/2018 |
| TW | 200928603 A | 7/2009 |
| WO | 2009149103 A1 | 12/2009 |

OTHER PUBLICATIONS

Jenoptik. Liquid Crystal Spatial Light Modulators description. http://www.jenoptik.com/en-liquid-crystal-spatial-light-modulators.

Tricard, Marc, Paul Dumas, and Joe Menapace. Continuous Phase Plate Polishing Using Magnetorheological Finishing. pp. 1-4. QED Technologies, Rochester, NY, USA and Lawrence Livermore National Laboratories, Livermore, CA, USA.

Menapace, Joseph A., Sham N. Dixit, Francois Y. Genin, and Wayne F. Brocious. Magnetorheological Finishing for Imprinting Continuous Phase Plate Structure onto Optical Surfaces. Laser-Induced Damage in Optical Materials. Downloaded from http://spiedigitallibrary.org on Dec. 14, 2012. pp. 220-230. vol. 5273. Bellingham, WA, USA.

Newport. Properties of Optical Materials. http://www.newport.com/Optical-Materials/144943/1033/content.aspx.

International Search Report dated Jun. 5, 2020 for PCT/US2020/017395.

International Search Report dated Mar. 10, 2020 for PCT/US2019/061059.

* cited by examiner

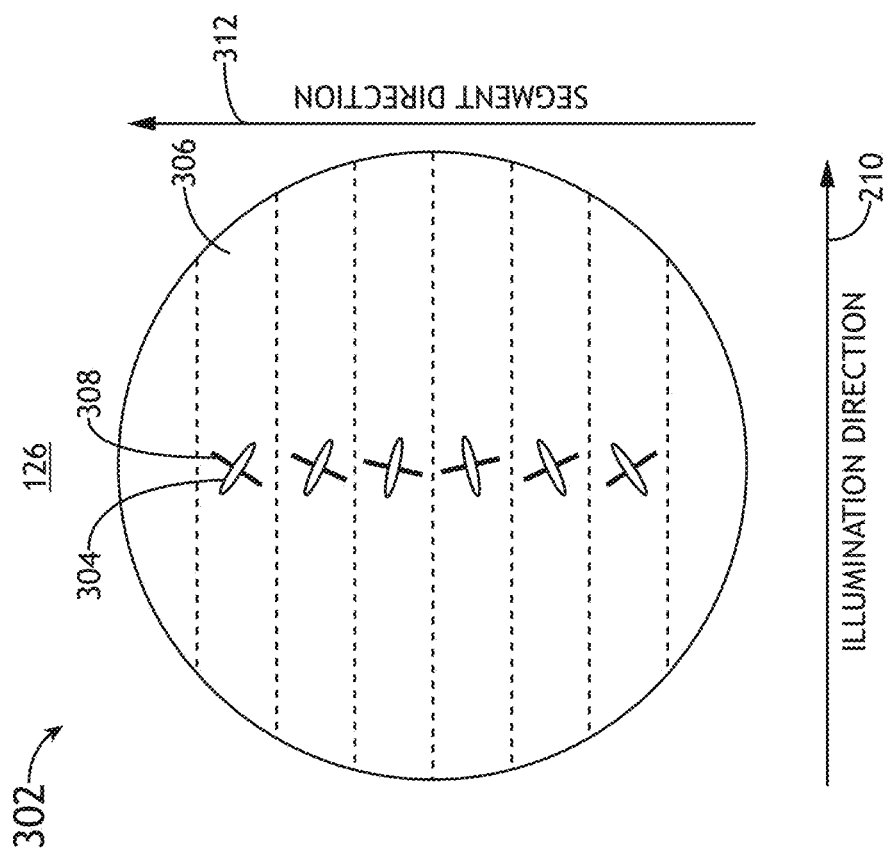
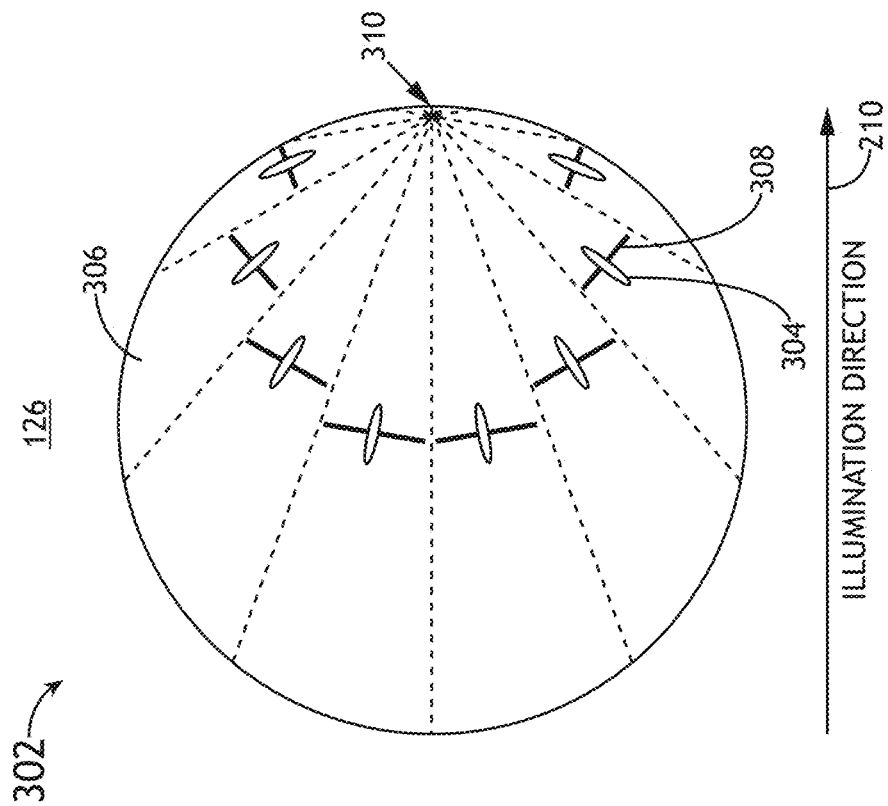

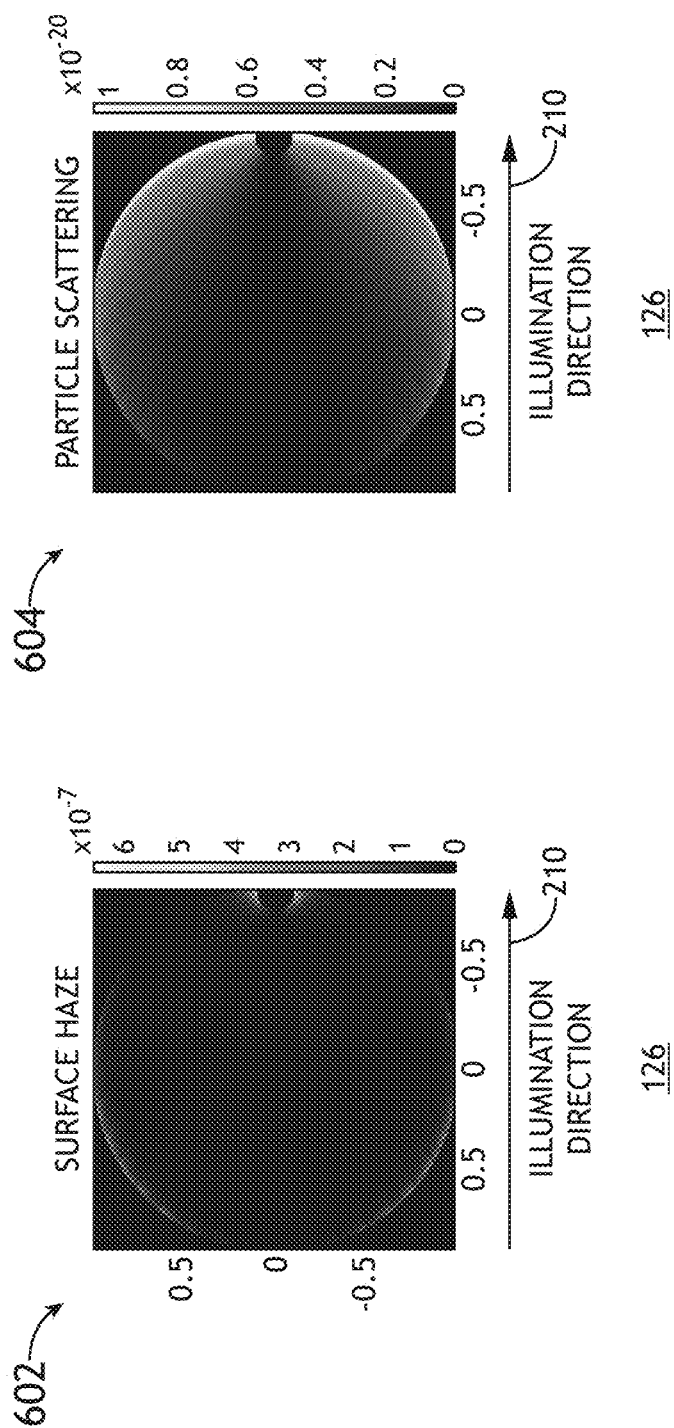

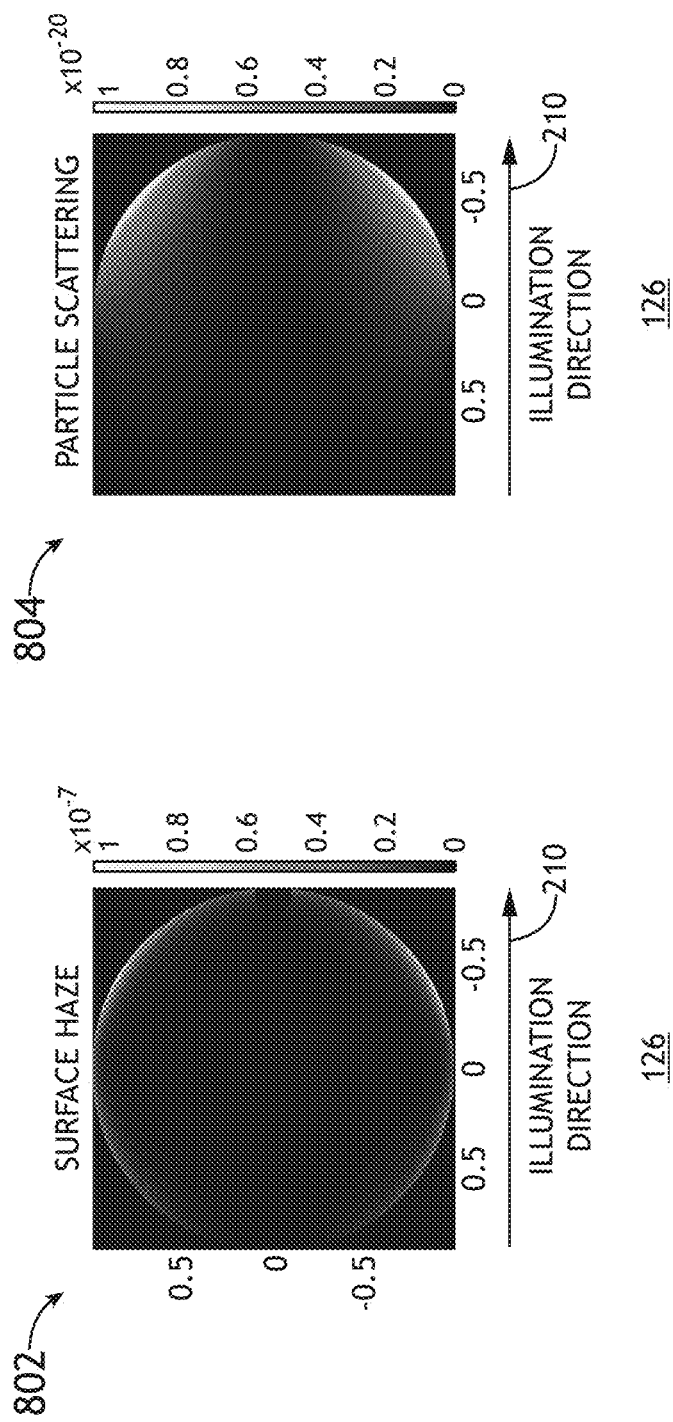

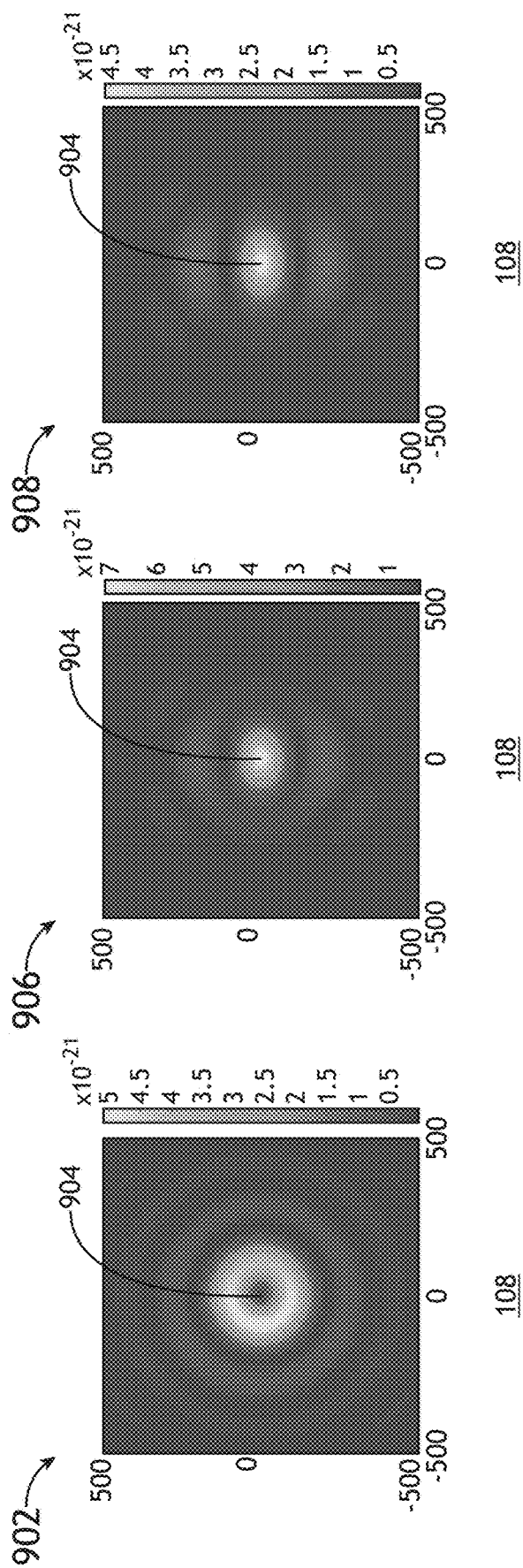

SENSITIVE PARTICLE DETECTION WITH SPATIALLY-VARYING POLARIZATION ROTATOR AND POLARIZER

CROSS-REFERENCE TO RELATED APPLICATION

The present application claims the benefit under 35 U.S.C. § 119(e) of U.S. Provisional Application Ser. No. 62/806,820, filed Feb. 17, 2019, entitled METHOD AND SYSTEM OF SENSITIVITY ENHANCEMENT FOR PARTICLE DETECTION IN WAFER INSPECTION SYSTEM, naming Xuefeng Liu and Jenn-Kuen Leong as inventors, which is incorporated herein by reference in the entirety.

TECHNICAL FIELD

The present disclosure is generally related to particle inspection and, more particularly, to particle inspection using dark-field imaging based on scattered or diffracted light.

BACKGROUND

Particle detection systems are commonly utilized in semiconductor processing lines to identify defects or particulates on wafers such as, but not limited to, unpatterned wafers. As semiconductor devices continue to shrink, particle detection systems require corresponding increases in sensitivity and resolution. A significant source of noise that may limit measurement sensitivity is surface scattering on a wafer (e.g., surface haze), which may be present even for optically polished surfaces. While various methods have been proposed to suppress surface scattering with respect to scattering from particles, such methods may fail to achieve desired sensitivity levels and/or may achieve sensitivity at the expense of degraded image quality. There is therefore a need to develop systems and methods that mitigate the deficiencies addressed above.

SUMMARY

A system is disclosed in accordance with one or more illustrative embodiments of the present disclosure. In one illustrative embodiment, the system includes an illumination source to generate an illumination beam. In another illustrative embodiment, the system includes one or more illumination optics to direct the illumination beam to a sample at an off-axis angle along an illumination direction. In another illustrative embodiment, the system includes one or more collection optics to collect scattered light from the sample in response to the illumination beam in a dark-field mode. In another illustrative embodiment, the system includes a polarization rotator located at a pupil plane of the one or more collection optics, where the polarization rotator provides a spatially-varying polarization rotation angle selected to rotate light scattered from a surface of the sample to a selected polarization angle. In another illustrative embodiment, the system includes a polarizer aligned to reject light polarized along the selected polarization angle to reject the light scattered from the surface of the sample. In another illustrative embodiment, the system includes a detector configured to generate a dark-field image of the sample based on scattered light from the sample passed by the polarizer, where the scattered light from the sample passed by the polarizer includes at least a portion of light scattered by one or more particles on the surface of the sample.

An apparatus is disclosed in accordance with one or more illustrative embodiments of the present disclosure. In one illustrative embodiment, the apparatus includes a polarization rotator located at a pupil plane of a dark-field imaging system, where the dark-field imaging system includes one or more collection optics to collect scattered light from a sample in response to off-axis illumination. In another illustrative embodiment, the polarization rotator provides a spatially-varying polarization rotation angle selected to rotate light scattered from a surface of the sample to a selected polarization angle. In another illustrative embodiment, the polarization rotator is configured to be coupled with a polarizer aligned to reject light polarized along the selected polarization angle to reject the light scattered from a surface of the sample.

A method is disclosed in accordance with one or more illustrative embodiments of the present disclosure. In one illustrative embodiment, the method includes receiving an electric field distribution of light scattered from a surface of a sample in response to an illumination beam with a known polarization at a known incidence angle. In another illustrative embodiment, the method includes designing a polarization rotator suitable for placement at a pupil plane of an imaging system to provide a spatially-varying polarization rotation angle selected to rotate a polarization of light having the electric field distribution to a selected polarization angle. In another illustrative embodiment, the method includes generating a dark-field image of a sample with the imaging system having the polarization rotator in the pupil plane and a linear polarizer aligned to reject light polarized along the selected polarization angle, where the dark-field image is based on light passed by the polarizer.

A system is disclosed in accordance with one or more illustrative embodiments of the present disclosure. In one illustrative embodiment, the system includes an illumination source to generate an illumination beam. In another illustrative embodiment, the system includes one or more illumination optics to direct the illumination beam to a sample at an off-axis angle along an illumination direction. In another illustrative embodiment, the system includes a detector. In another illustrative embodiment, the system includes one or more collection optics to generate a dark-field image of the sample on the detector based on light collected from the sample in response to the illumination beam. In one illustrative embodiment, the system includes a segmented polarizer including a plurality of segments distributed in a pupil plane of the one or more collection optics, wherein a rejection axis of each segment is oriented to reject light scattered from a surface of the sample within the segment.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3A is a conceptual top view of a segmented polarizer having wedge-shaped segments distributed radially around an apex location, in accordance with one or more embodiments of the present disclosure;

FIG. 3B is a conceptual top view of a segmented polarizer in which segments are linearly distributed along a selected segmentation direction in the pupil plane, in accordance with one or more embodiments of the present disclosure;

FIGS. 6A and 6B are plots of orthogonally polarized portions of the collected sample light after propagating through an angularly-segmented polarization rotator and a polarizing beamsplitter, in accordance with one or more embodiments of the present disclosure;

FIGS. 8A and 8B are plots of orthogonally polarized portions of the collected sample light after propagating through an angularly-segmented polarization rotator and a polarizing beamsplitter, in accordance with one or more embodiments of the present disclosure;

FIG. 9A is an image of a particle smaller than a resolution of an imaging system generated based on scattering of obliquely-incident p-polarized light, in accordance with one or more embodiments of the present disclosure;

FIG. 9B includes an image of the particle in FIG. 8A using an imaging system with an angularly-segmented polarization rotator as illustrated in FIG. 5 and a polarizing beamsplitter, in accordance with one or more embodiments of the present disclosure;

FIG. 9C includes an image of the particle in FIG. 9A using an imaging system with a linearly-segmented polarization rotator as illustrated in FIG. 7A with 72 segments and a linear polarizer, in accordance with one or more embodiments of the present disclosure;

DETAILED DESCRIPTION

Figure 1:
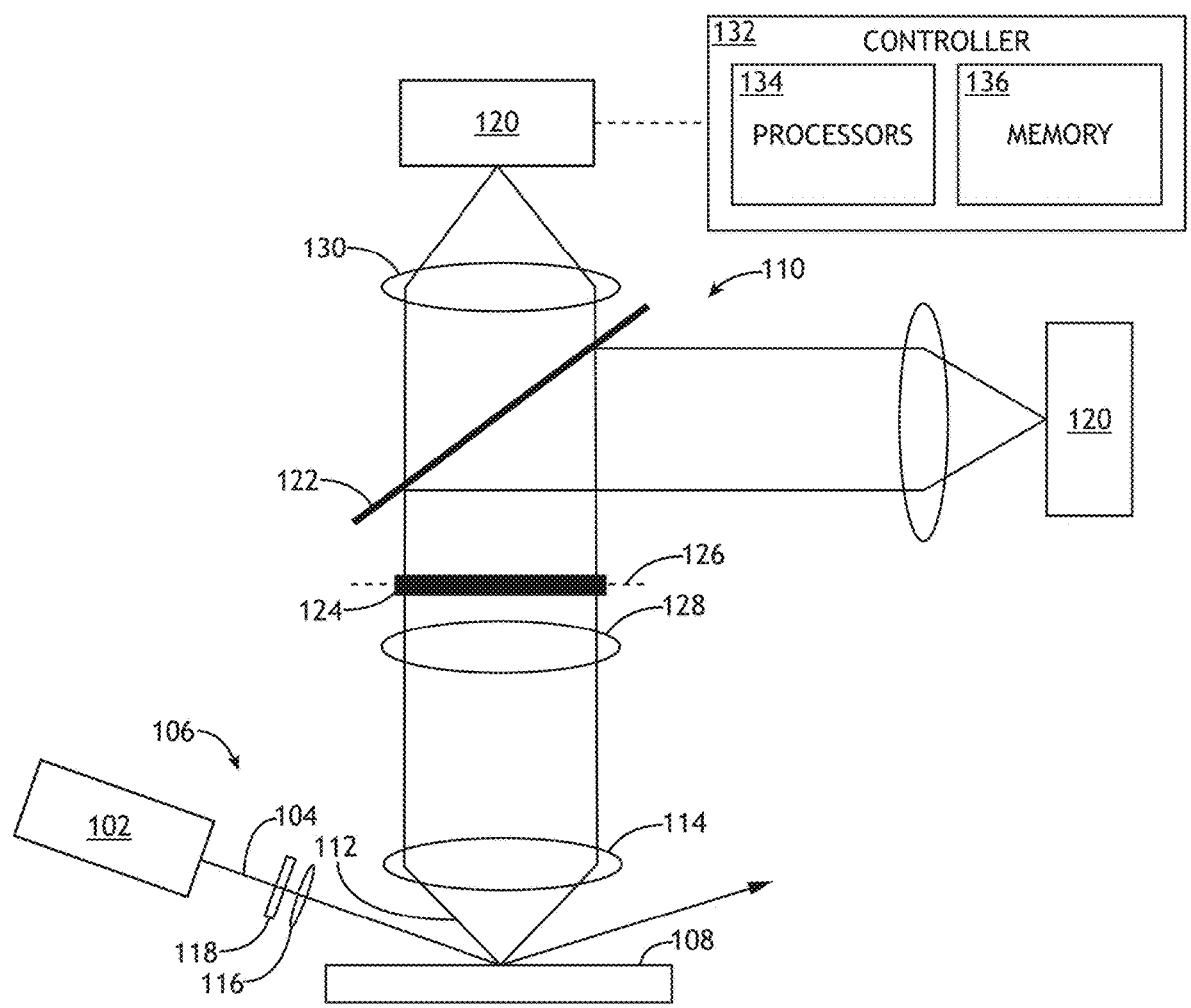
FIG. 1 is a conceptual view of a particle detection system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. As used herein, directional terms such as "left", "right", "top", "bottom", "over", "under", "upper", "upward", "lower", "down" and "downward" are intended to provide relative positions for purposes of description, and are not intended to designate an absolute frame of reference. It should be readily apparent to those of ordinary skill in the art that various changes and modifications in form and detail may be made without departing from the spirit and scope of the disclosure.

Embodiments of the present disclosure are directed to systems and methods for particle detection based on dark-field imaging in which surface scattering (e.g., surface haze) is separated from light scattered by particles on a surface (e.g., particle scattering). Additional embodiments of the present disclosure are directed to simultaneously generating separate images of a sample based on surface scattering and particle scattering.

Wafer inspection is generally described in U.S. Pat. No. 9,874,526 issued on Jan. 1, 2018, U.S. Pat. No. 9,291,575 issued on Mar. 22, 2016, U.S. Pat. No. 8,891,079 issued on Nov. 18, 2014, and U.S. Pat. No. 9,891,177 issued on Feb. 13, 2018, all of which are incorporated herein in their entirety. Further, for the purposes of this disclosure, a particle may include any surface defect on a sample of interest including, but not limited to, a foreign particulate, a scratch, a pit, a hole, a bump, or the like.

It is recognized herein that light scattered from a particle and light scattered from a surface may exhibit different electric field distributions (e.g., polarization and electric field strength) as a function of scattering angle. Further, differences in the electric field distribution (e.g., scattering map) may be particularly significant for obliquely-incident p-polarized light. For example, surface haze from obliquely-incident p-polarized light may be approximately radially polarized with respect to an angle of specular reflection, whereas scattering from a particle may be approximately radially polarized with respect to a surface normal.

In some embodiments, a dark-field imaging system includes a polarization rotator in a pupil plane to selectively rotate the polarization of surface haze to a selected polarization angle and a linear polarizer to separate the surface haze that is polarized along the selected polarization angle from the remaining signal (e.g., particle scattering) into different imaging channels. For example, the polarization rotator may provide varying polarization rotation angles across the pupil plane based on a known or expected polarization distribution of surface haze, where a spatial distribution of polarization rotation angle across the pupil is selected to rotate the surface haze distributed across the pupil to a common selected polarization angle. In this regard, a linear polarizer (e.g., a polarizing beamsplitter) aligned to this selected polarization angle may effectively separate the surface haze from the particle scattering.

Additional embodiments of the present disclosure are directed to a polarization rotator for providing a spatially-varying amount of polarization rotation suitable for use in a pupil plane of an imaging system. Multiple configurations of a polarization rotator are contemplated herein. In some embodiments, a polarization rotator includes a segmented half-wave plate including multiple half-wave plates with different orientations of the optic axes. For example, the polarization rotator may include multiple half-wave plates distributed radially around an apex location such as, but not limited to, a point in the pupil plane corresponding to specular reflection of an illumination beam. In this regard, each half-wave plate may cover a range of radial angles around the specular reflection angle (e.g., to mimic the approximately radial polarization distribution of surface haze). By way of another example, the polarization rotator may include a series of half-wave plates linearly distributed along a single direction in the pupil plane. In some embodiments, a polarization rotator includes an optically-active material having a spatially-varying thickness. In this regard, the thickness at a given point in the pupil plane may determine the angle of polarization rotation.

Additional embodiments of the present disclosure are directed to a method for designing a spatial distribution of polarization rotation angle suitable for rotating surface haze to a selected polarization angle for filtering with a polarizing beamsplitter. For example, a polarization rotator may be designed to selectively rotate light associated with any source of noise to a common selected polarization angle for filtering using a polarizing beamsplitter. Accordingly, while the present disclosure focuses primarily on surface haze based on obliquely-incident p-polarized light, the examples herein are provided solely for illustrative purposes and should not be interpreted as a limitation. Rather, it is contemplated herein that the systems and methods described herein may be applied to light with any wavelength, polarization, or angle of incidence.

Additional embodiments of the present disclosure are directed to a segmented polarizer suitable for use in a pupil plane of an imaging system for selectively filtering (e.g., through absorption in the segmented polarizer) surface haze based on a known distribution of polarization angles of surface haze in the pupil plane. For example, a segmented polarizer may include multiple polarizers distributed across the pupil plane, where each polarizer is oriented to block light along a selected direction. Multiple configurations of a segmented polarizer are contemplated herein. In some embodiments, a segmented polarizer includes multiple polarizers distributed radially around an apex location such as, but not limited to, a point in the pupil plane corresponding to specular reflection of an illumination beam. In some embodiments, a segmented polarizer includes multiple polarizers distributed linearly in the pupil plane.

Referring now to FIGS. 1 through 13B, systems and methods for sensitive particle detection will be described in greater detail.

FIG. 1 is a conceptual view of a particle detection system 100, in accordance with one or more embodiments of the present disclosure. In one embodiment, the particle detection system 100 includes an illumination source 102 to generate an illumination beam 104, an illumination pathway 106 including one or more illumination optics to direct the illumination beam 104 to a sample 108, and a collection pathway 110 including one or more collection optics to collect light emanating from the sample 108 (e.g., sample light 112). For example, the collection pathway 110 may include an objective lens 114 to collect at least a portion of the sample light 112. The sample light 112 may include any type of light emanating from the sample 108 in response to the illumination beam 104 including, but not limited to, scattered light, reflected light, diffracted light, or luminescence.

The illumination beam 104 may include one or more selected wavelengths of light including, but not limited to, ultraviolet (UV) radiation, visible radiation, or infrared (IR) radiation. For example, the illumination source 102 may provide, but is not required to provide, an illumination beam 104 having wavelengths shorter than approximately 350 nm. By way of another example, the illumination beam 104 may provide wavelengths of approximately 266 nm. By way of another example, the illumination beam 104 may provide wavelengths of approximately 213 nm. It is recognized herein that imaging resolution and light scattering by small particles (e.g., relative to the wavelength of the illumination beam 104) both generally scale with wavelength such that decreasing the wavelength of the illumination beam 104 may generally increase the imaging resolution and scattering signal from the small particles. Accordingly, illumination beam 104 may include short-wavelength light including, but not limited to, extreme ultraviolet (EUV) light, deep ultraviolet (DUV) light, or vacuum ultraviolet (VUV) light.

The illumination source 102 may include any type of light source known in the art. Further, the illumination source 102 may provide an illumination beam 104 having any selected spatial or temporal coherence characteristics. In one embodiment, the illumination source 102 includes one or more laser sources such as, but not limited to, one or more narrowband laser sources, one or more broadband laser sources, one or more supercontinuum laser sources, or one or more white light laser sources. In another embodiment, the illumination source 102 includes a laser-driven light source (LDLS) such as, but not limited to, a laser-sustained plasma (LSP) source. For example, the illumination source 102 may include, but is not limited to, a LSP lamp, a LSP bulb, or a LSP chamber suitable for containing one or more elements that, when excited by a laser source into a plasma state, may emit broadband illumination. In another embodiment, the illumination source 102 includes a lamp source such as, but not limited to, an arc lamp, a discharge lamp, or an electrode-less lamp.

In another embodiment, the illumination source 102 provides a tunable illumination beam 104. For example, the illumination source 102 may include a tunable source of illumination (e.g., one or more tunable lasers, and the like). By way of another example, the illumination source 102 may include a broadband illumination source coupled to any combination of fixed or tunable filters.

The illumination source 102 may further provide an illumination beam 104 having any temporal profile. For example, the illumination beam 104 may have a continuous temporal profile, a modulated temporal profile, a pulsed temporal profile, and the like.

It is recognized herein that the strength of surface haze may depend on multiple factors including, but not limited to incidence angle or polarization of the illumination beam 104. For example, the strength of surface haze may be relatively high for near-normal angles of incidence and may drop off for higher incidence angles. In one embodiment, the illumination pathway 106 may include one or more illumination optics such as, but not limited to, lenses 116, mirrors, and the like to direct the illumination beam 104 to the sample 108 at an oblique incidence angle to decrease the generation of surface haze. The oblique incidence angle may generally include any selected incidence angle. For example, the incidence angle may be, but is not required to be, greater than 60 degrees with respect to a surface normal.

In another embodiment, the illumination pathway 106 includes one or more illumination beam-conditioning components 118 suitable for modifying and/or conditioning the illumination beam 104. For example, the one or more illumination beam-conditioning components 118 may include, but are not limited to, one or more polarizers, one or more waveplates, one or more filters, one or more beamsplitters, one or more diffusers, one or more homogenizers, one or more apodizers, or one or more beam shapers. In one embodiment, the one or more illumination beam-conditioning components 118 include a polarizer or waveplate oriented to provide a p-polarized illumination beam 104 on the sample 108.

In another embodiment, the particle detection system 100 includes at least one detector 120 configured to capture at least a portion of the sample light 112 collected by the collection pathway 110. The detector 120 may include any type of optical detector known in the art suitable for measuring illumination received from the sample 108. For example, a detector 120 may include a multi-pixel detector suitable for capturing an image of the sample 108 such as, but not limited to, a charge-coupled device (CCD) detector, a complementary metal-oxide-semiconductor (CMOS) detector, a time-delayed integration (TDI) detector, a photomultiplier tube (PMT) array, an avalanche photodiode (APD) array, or the like. In another embodiment, a detector 120 includes a spectroscopic detector suitable for identifying wavelengths of the sample light 112.

The particle detection system 100 may include any number of detectors 120 to simultaneously image the sample 108. Further, the collection pathway 110 may include a linear polarizer 122 configured to filter the sample light 112 to be imaged on a detector 120 based on polarization. In one embodiment, as illustrated in FIG. 1, the linear polarizer 122 operates as a polarizing beamsplitter such that linear polarizer 122 splits the sample light 112 into two orthogonally-polarized beams. The particle detection system 100 may then include a detector 120 for generating an image of the sample 108 with each of the orthogonally-polarized portions the sample light 112.

The collection pathway 110 may include any number of beam-conditioning elements 124 to direct and/or modify the sample light 112 including, but not limited to, one or more lenses, one or more filters, one or more apertures, one or more polarizers, or one or more phase plates.

In one embodiment, as illustrated in FIG. 1, the collection pathway 110 includes one or more beam-conditioning elements 124 located at or near a pupil plane 126. For example, as will be discussed in greater detail below, the collection pathway 110 may include beam-conditioning elements 124 such as, but not limited to, a continuous polarizer or a phase mask at or near a pupil plane 126. In this regard, the particle detection system 100 may control and/or adjust selected aspects of the sample light 112 used to generate an image on the detector 120 including, but not limited to, the intensity, phase, and polarization of the sample light 112 as a function of scattering angle and/or position on the sample.

Further, the collection pathway 110 may have any number of pupil planes 126. For example, as illustrated in FIG. 1, the collection pathway 110 may include one or more lenses 128 to generate an image of the pupil plane 126 and one or more lenses 130 to generate an image of the surface of the sample 108 on the detector 120. However, it is recognized herein that a limited number of beam-conditioning elements 124 may be placed at a particular pupil plane 126 or sufficiently near a particular pupil plane 126 to provide a desired effect. Accordingly, for the purposes of the present disclosure, reference to one or more elements at a pupil plane 126 may generally describe one or more elements at or sufficiently close to a pupil plane 126 to produce a desired effect. In some embodiments, though not shown, the collection pathway 110 may include additional lenses to generate one or more additional pupil planes 126 such that any number of beam-conditioning elements 124 may be placed at or near a pupil plane 126.

In another embodiment, the particle detection system 100 includes a controller 132 including one or more processors 134 configured to execute program instructions maintained on a memory medium 136 (e.g., memory). Further, the controller 132 may be communicatively coupled to any components of the particle detection system 100. In this regard, the one or more processors 134 of controller 132 may execute any of the various process steps described throughout the present disclosure. For example, the controller 132 may receive, analyze, and/or process data from the detector 120 (e.g., associated with an image of the sample 108). By way of another example, the controller 132 may control or otherwise direct any components of the particle detection system 100 using control signals.

The one or more processors 134 of a controller 132 may include any processing element known in the art. In this sense, the one or more processors 134 may include any microprocessor-type device configured to execute algorithms and/or instructions. In one embodiment, the one or more processors 134 may consist of a desktop computer, mainframe computer system, workstation, image computer, parallel processor, or any other computer system (e.g., networked computer) configured to execute a program configured to operate the particle detection system 100, as described throughout the present disclosure. It is further recognized that the term "processor" may be broadly defined to encompass any device having one or more processing elements, which execute program instructions from a non-transitory memory medium 136. Further, the steps described throughout the present disclosure may be carried out by a single controller 132 or, alternatively, multiple controllers. Additionally, the controller 132 may include one or more controllers housed in a common housing or within multiple housings. In this way, any controller or combination of controllers may be separately packaged as a module suitable for integration into particle detection system 100.

The memory medium 136 may include any storage medium known in the art suitable for storing program instructions executable by the associated one or more processors 134. For example, the memory medium 136 may include a non-transitory memory medium. By way of another example, the memory medium 136 may include, but is not limited to, a read-only memory (ROM), a random-access memory (RAM), a magnetic or optical memory device (e.g., disk), a magnetic tape, a solid-state drive, and the like. It is further noted that memory medium 136 may be housed in a common controller housing with the one or more processors 134. In one embodiment, the memory medium 136 may be located remotely with respect to the physical location of the one or more processors 134 and controller 132. For instance, the one or more processors 134 of controller 132 may access a remote memory (e.g., server), accessible through a network (e.g., internet, intranet, and the like). Therefore, the above description should not be interpreted as a limitation on the present invention but merely an illustration.

It is contemplated herein that the particle detection system 100 may be configured as any type of image-based particle detection system known in the art. In one embodiment, as illustrated in FIG. 1, the particle detection system 100 is a dark-field imaging system to exclude specularly-reflected light. In this regard, the particle detection system 100 may image the sample 108 based primarily on scattered light. Dark-field imaging may further be implemented using any technique known in the art. In one embodiment, an orientation and/or a numerical aperture (NA) of the objective lens 114 may be selected such that the objective lens 114 does not collect specularly-reflected light. For example, as illustrated in FIG. 1, the objective lens 114 is oriented approximately normal to the sample 108 and has a NA that does not include a specularly-reflection portion of the illumination beam 104. Further, the objective lens 114 may have, but is not required to have, a NA of approximately 0.9 or greater. In another embodiment, the particle detection system 100 may include one or more components to block specular reflection from reaching the detector 120.

Referring now to FIGS. 2A through 3B, pupil-plane polarization rotation of surface haze and subsequent filtering is described in greater detail.

It is recognized herein that light scattered from the surface of a sample (e.g., surface haze, surface scattering, or the like) may be considered noise in particle detection applications. Accordingly, it may be desirable to filter portions of the sample light 112 associated with surface haze from portions of the sample light 112 associated with light scattered by particles of interest.

Figure 2B:
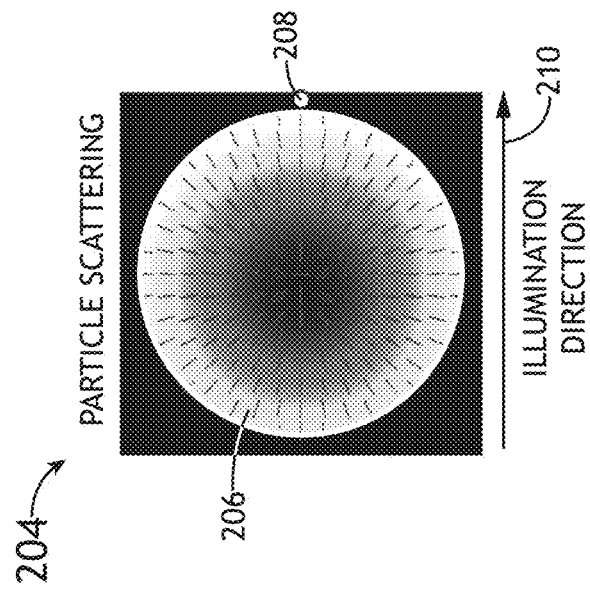
FIG. 2B is a pupil-plane scattering map of light scattered by a sub-resolution particle in response to obliquely-incident p-polarized light, in accordance with one or more embodiments of the present disclosure.
Figure 2A:
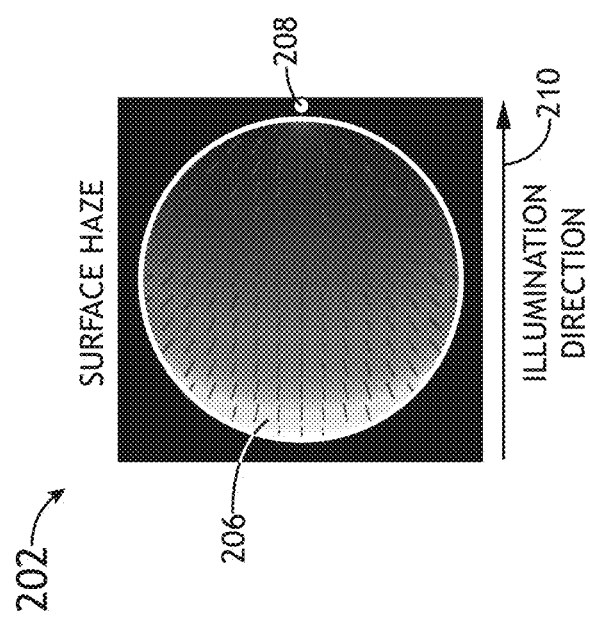
FIG. 2A is a pupil-plane scattering map of surface scattering in response to obliquely-incident p-polarized light, in accordance with one or more embodiments of the present disclosure.

FIG. 2A is a pupil-plane scattering map 202 of surface scattering (e.g., surface haze) in response to obliquely-incident p-polarized light, in accordance with one or more embodiments of the present disclosure. FIG. 2B is a pupil-plane scattering map 204 of light scattered by a small particle (e.g., small relative to an imaging resolution of the particle detection system 100 or a wavelength of the illumination beam 104) in response to obliquely-incident p-polarized light, in accordance with one or more embodiments of the present disclosure.

In particular, the scattering maps 202, 204 include the electric field strength indicated by the shading with white as the highest intensity and black as the lowest intensity. Further, the scattering maps 202, 204 include the polarization orientation of light as a function of collection angle (e.g., scattering angle) in the pupil plane 126 indicated by the overlaid ellipses. The scattering maps 202, 204 are bounded by a collection area 206 in the pupil plane 126, which is associated with the range of angles that sample light 112 is collected by the particle detection system 100. For example, the collection area 206 may correspond to the numerical aperture (NA) of the objective lens 114.

The scattering maps 202, 204 are based on a configuration of the particle detection system 100 illustrated in FIG. 1. In FIGS. 2A and 2B, the specular reflection angle 208 is located outside of the collection area 206 along the illumination direction 210 (e.g., outside the collection area 206 on the right side of the circular collection area 206 in FIG. 2A), indicating that the objective lens 114 does not capture specularly-reflected light. However, alternative configurations are within the scope of the present disclosure. For example, in the case that the specular reflection angle 208 lies within the pupil plane 126, the specularly-reflected light may be blocked prior to the detector 120 to generate a dark-field image.

Additionally, the scattering maps 202, 204 may be representative of scattering from a wide variety of materials including, but not limited to, silicon, epitaxial, and polysilicon wafers. However, it is to be understood that the scattering maps 202, 204 are provided solely for illustrative purposes and should not be interpreted as limiting the present disclosure.

As illustrated in FIGS. 2A and 2B, the electric field distribution (e.g., electric field strength and polarization orientation) of light scattered by a particle may differ substantially from the electric field distribution of light scattered by a surface, particularly when the illumination beam 104 is p-polarized. For example, sample light 112 associated with surface haze generally exhibits an approximately radial polarization distribution with respect to the specular reflection angle 208 in the collection area 206 as illustrated in FIG. 2A. In contrast, sample light 112 associated with particle scattering generally exhibits a radial polarization distribution with respect to the surface normal as illustrated in FIG. 2B. Further, the polarization of the scattered sample light 112 is generally elliptical. As can be seen from FIGS. 2A and 2B, at most locations in the pupil plane 126, the ellipses are very elongated meaning that one linear polarization component is much stronger than the other. For the sample light 112 scattered from a small particle (e.g., FIG. 2B), the polarization may be more elliptical near the center of the pupil, meaning that the two linear polarization components can be roughly comparable in magnitude. However, the intensity of the light in this region of the pupil is relatively low and contribute little to the total scattering signal from a small particle.

In one embodiment, the particle detection system 100 includes a polarizer located at or near the pupil plane 126 to preferentially reject surface haze. In a general sense, a polarizer located at or near the pupil plane 126 may be designed to provide spatially-varying polarization-filtering corresponding to any known, measured, simulated, or otherwise expected polarization of light. In the context of the present disclosure, a polarizer located at or near the pupil plane 126 may preferentially filter surface haze based on a known electric field distribution in the pupil plane 126. Accordingly, in some embodiments, the particle detection system 100 includes a radial haze-rejection polarizer located at or near the pupil plane 126 to preferentially reject the approximately radially-polarized surface haze illustrated in FIG. 2A.

Referring now to FIGS. 3A and 3B, a segmented haze-rejection polarizer 302 suitable for preferentially filtering surface haze from particle scattering are described in accordance with one or more embodiments of the present disclosure. In a general sense, a haze-rejection polarizer 302 may be designed to provide spatially-varying polarization-filtering corresponding to any known, measured, simulated, or otherwise expected polarization of light. In the context of the present disclosure, a haze-rejection polarizer 302 may preferentially filter surface haze based on a known electric field distribution in the pupil plane 126 (e.g., the electric field distribution of surface haze illustrated in FIG. 2A). FIGS. 3A and 3B include polarization ellipses 304 representative of the polarization of surface haze in the pupil plane 126 based on FIG. 2A.

A haze-rejection polarizer 302 may include any number of segments 306 distributed across the pupil plane 126, where each segment 306 may include a linear polarizer oriented pass light polarized along a selected pass polarization direction 308. In this regard, the haze-rejection polarizer 302 may provide a spatially-varying distribution of passed polarization angles.

In one embodiment, the pass polarization direction 308 of each segment 306 of a haze-rejection polarizer 302 is oriented to preferentially reject surface haze. For example, the pass polarization direction 308 for each segment 306 may be oriented orthogonal to the expected polarization ellipses 304 within the corresponding portion of the pupil plane 126.

FIG. 3A is a conceptual top view of a haze-rejection polarizer 302 (e.g., an angularly-segmented polarizer) having wedge-shaped segments 306 distributed radially around an apex location 310, in accordance with one or more embodiments of the present disclosure. In one embodiment, the apex location 310 of the haze-rejection polarizer 302 is oriented to coincide with a point in the pupil plane 126 associated with specular reflection angle of the illumination beam 104 from the sample 108. In this regard, each segment 306 may cover a range of radial angles in the pupil plane 126 with respect to the specular reflection angle 208 such that surface haze within each segment 306 may be substantially uniform based on the scattering map 202 in FIG. 2A. Further, each the pass polarization direction 308 for each segment 306 may be oriented to reject light having a radial polarization with respect to the apex location 310 in order to preferentially reject the surface haze.

The specular reflection angle 208 may be located within or outside of the collection area 206 as described previously herein. Further, apex location 310 need not necessarily lie within the physical structure of the haze-rejection polarizer 302. For example, in the case where the specular reflection angle 208 is located outside of the collection area 206, the segments 306 may be oriented as if they would converge on an apex location 310 outside the boundaries defining the size of the haze-rejection polarizer 302.

FIG. 3B is a conceptual top view of a haze-rejection polarizer 302 (e.g., a linearly-segmented polarizer) in which segments 306 are linearly distributed along a selected segmentation direction 312 in the pupil plane 126, in accordance with one or more embodiments of the present disclosure. For example, the segmentation direction 312 in FIG. 3B is selected to be orthogonal to the illumination direction 210 as represented in the pupil plane 126. In this regard, the pass polarization direction 308 for each segment 306 may be chosen to substantially reduce the transmission of the surface scattered light through that segment 306.

It is recognized herein that the accuracy at which the haze-rejection polarizer 302 may preferentially filter surface haze may vary based on the number and layout of segments 306 with respect to an expected scattering map of surface haze. It is further recognized herein that the manufacturing cost of a haze-rejection polarizer 302 may also scale with complexity. Accordingly, the number and layout of segments 306 may be selected to balance various requirements including performance, manufacturing cost, and the like.

Further, the in the case that the polarization ellipses 304 are not uniformly oriented in a particular segment 306, the pass polarization direction 308 in a particular segment 306 may be selected to reject surface haze according to an optimization function. For example, the pass polarization direction 308 for each segment 306 may be selected based on an expected polarization distribution (e.g., as illustrated in FIG. 2A, or the like) to be orthogonal to a weighted average of the expected directions of the long axes of the polarization ellipses 304 within each segment 306, where the weighting is proportional to the expected field strength or intensity across the segment 306. By way of another example, the pass polarization direction 308 for each segment 306 may be selected to maximize the ratio of transmitted sample light 112 associated with particle scattering to transmitted surface haze.

Figure 4:
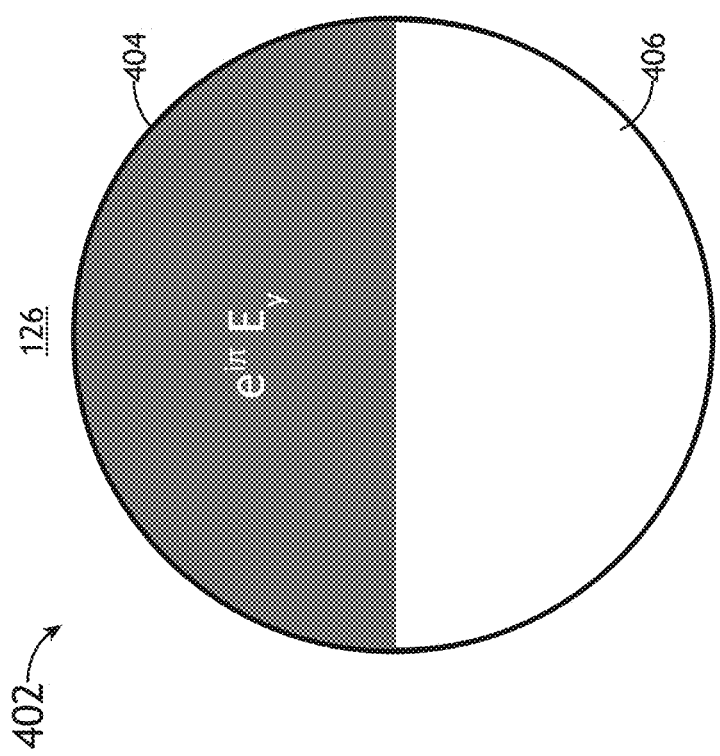
FIG. 4 is a conceptual top view of a phase mask including two segments to divide the pupil into two segments, in accordance with one or more embodiments of the present disclosure.

Referring now to FIG. 4, in some embodiments, the particle detection system 100 includes one or more components located at or near the pupil plane 126 to reshape the point spread function (PSF) of p-polarized light scattered by sub-resolution particles. It is recognized herein that the image of a particle smaller than an imaging resolution of a system is generally limited by the system PSF, which is typically an Airy function when the image is formed from specularly-reflected light. However, the actual PSF associated with a particle (e.g., a particle PSF) and thus an actual image of the particle generated by a system is related to the particular electric field distribution of light from a particle in the pupil plane 126 and may have a different size or shape than the system PSF, particularly when the image is formed from scattered light.

In particular, a dark-field image of a particle (e.g., an image of a particle formed with scattered or diffracted light) smaller than the imaging resolution when illuminated with oblique p-polarized light may be an annulus that spreads to an area larger than the system PSF, which negatively impacts particle detection sensitivity. This annulus shape and increase in the size of the PSF or imaged spot of a particle may be associated with destructive interference of collected light at a center of the imaged spot of a particle on the detector 120.

Accordingly, in some embodiments, the particle detection system 100 includes one or more components to modify the phase of sample light 112 across the pupil plane 126 to facilitate constructive interference of light at the center of an imaged spot of a particle on the detector 120 such as, but not limited to, one or more phase plates or one or more phase compensators.

For example, a phase mask may have various configurations suitable for reshaping the PSF of imaged particles. Phase masks for reshaping the PSF of imaged particles based on scattered light are generally described in U.S. patent application Ser. No. 16/577,089 titled RADIAL POLARIZER FOR PARTICLE DETECTION and filed on Sep. 20, 2019, which is incorporated herein by reference in its entirety. In some embodiments, a phase mask may include one or more half-wave plates covering selected portions of the pupil plane 126. In this regard, the phase mask may be formed as a segmented optic where at least one of the segments includes a half-wave plate.

FIG. 4 is a conceptual top view of a phase mask 402 including two segments to divide the pupil into two segments (e.g., halves), in accordance with one or more embodiments of the present disclosure. For example, as illustrated in FIG. 4, the phase mask 402 may include a segment 404 formed from a half-wave plate with an optic axis along an X direction to introduce a phase shift of $\pi$ for light polarized along the Y direction with respect to orthogonal polarizations (represented as $e^{i\pi}E_y$). Further, the phase mask 402 may include a segment 406 that does not rotate the polarization of light. For example, the segment 406 may include a compensating plate formed from an optically homogenous material along the direction of propagation such that light through the segment 406 propagates along the same (or substantially the same) optical path length as light in segment 404. In one embodiment, the compensating plate is formed from a material having approximately the same thickness and index of refraction as a half-wave plate in segment 404, but without birefringence along the propagation direction. In another embodiment, the compensating plate is formed from the same material as the half-wave plate in segment 404, but cut along a different axis such that light propagating through the compensating plate does not experience birefringence. For instance, light propagating along the optic axis of a uniaxial crystal may not experience birefringence such that the crystal may be optically homogenous for light propagating along the optic axis. By way of another example, the segment 406 may include an aperture.

Further, in some embodiments, a phase mask 402 may be tilted out of the pupil plane 126 to at least partially compensate for optical path length differences across the pupil plane 126.

A segmented phase mask 402 may be formed using any technique known in the art. In one embodiment, the various segments (e.g., segments 404-406 of FIG. 4) are formed as a single component in which the various segments are placed in a single plane.

It is to be understood, however, that FIG. 4 and the associated description are provided solely for illustrative purposes and should not be interpreted as limiting. For example, a phase mask 402 with two segments may include a half-wave plate placed in the bottom portion of the collection area 206 rather than the top portion as illustrated in FIG. 4. Further, the phase mask 402 may include any number of segments distributed formed from any combination of materials in any pattern across the pupil plane 126 so as to reshape the PSF of light scattered from a particle. For example, given a known electric field distribution of light in the pupil plane 126 (e.g., measured, simulated, or the like) associated with an object of interest, a segmented phase mask 402 as described herein may be formed to selectively adjust the phase of various regions of light in the pupil plane 126 to reshape the PSF of an image of the object of interest. In particular, the various segments of the phase mask 402 may be selected to facilitate constructive interference at a detector 120 to provide a tight PSF that approaches the system PSF (e.g., within a selected tolerance).

It is further recognized herein that the design of the phase mask 402 may represent a tradeoff between an "ideal" phase mask based on a known electric field distribution associated with particles of interest (e.g., as illustrated in FIG. 2A, or the like) and practical design and/or manufacturing considerations. For example, it may be the case that an ideal or otherwise desired phase mask 402 is unjustifiably expensive or difficult to manufacture. However, it may be the case that certain designs of the phase mask 402 may satisfy both manufacturing and performance specifications (e.g., a particle PSF having a selected shape, or the like). Accordingly, the designs of the phase mask 402 illustrated in FIG. 4 may represent a non-limiting example providing a particular tradeoff between performance and manufacturability.

In another embodiment, as will be described in greater detail below, the particle detection system 100 may include a phase compensator formed from an optical homogenous material having a spatially-varying thickness across the pupil plane 126 to facilitate constructive interference of sample light 112 associated with particle scattering at a center of an image of the particle on the detector 120.

As described previously herein, it is contemplated herein that various combinations of optical components may be used to selectively filter surface haze from sample light 112 scattered by a particle on a sample 108. Referring now to FIGS. 5 through 14B, in some embodiments, a particle detection system 100 includes a polarization rotator 502 to rotate surface haze across the pupil plane 126 to a selected common polarization angle followed by a linear polarizer 122 oriented to reject light along the selected polarization direction. For example, a polarization rotator 502 in the pupil plane 126 may provide a spatially-varying amount of polarization rotation (e.g., a spatially-varying polarization rotation angle) across the pupil plane 126. This spatial distribution of the polarization rotation angle may be selected based on an expected electric field distribution of surface haze (e.g., the scattering map 202 in FIG. 2A) to selectively rotate the polarization of surface haze across the pupil plane 126 to the selected polarization angle. The particle detection system 100 may additionally include a linear polarizer (e.g., the linear polarizer 122) aligned to reject light polarized along the selected polarization angle.

Further, it is contemplated herein that the selected polarization angle for rejection of the surface haze may be any suitable angle. For example, the selected polarization angle may be chosen based on an expected distribution of particle-scattered sample light 112 (e.g., as illustrated in FIG. 2B) to minimize the intensity of rejected particle-scattered sample light 112.

The linear polarizer 122 may reject the sample light 112 polarized along the selected polarization direction via any process including transmission, reflection, or absorption. In one embodiment, as illustrated in FIG. 1, the linear polarizer 122 includes a polarizing beamsplitter such that the sample light 112 polarized along the selected polarization direction (primarily surface haze) is directed along one optical path (e.g., via transmission or reflection) and orthogonally-polarized sample light 112 (primarily particle-scattered sample light 112) is directed along another optical path. Accordingly, the particle detection system 100 may include a detector 120 in either or both optical paths to generate images of the sample 108 based on the corresponding portion of the sample light 112.

It is recognized herein that retaining the portion of the sample light 112 associated with surface haze may be desirable in many applications. For example, it may be desirable to monitor relative signal strengths associated with surface haze and particle scattering. By way of another example, it may be desirable to generate an image associated with surface haze. In some instances, a sample imaged with surface haze may provide additional relevant metrology data associated with the sample surface. Further, it may be the case that the combination of the polarization rotator 502 and linear polarizer 122 may not fully separate the surface haze from the particle-scattered sample light 112. Accordingly, a multi-channel imaging system in which a first channel primarily includes light scattered from particles and a second channel primarily includes light scattered from the surface may facilitate verification of the system performance suitable for refining the design of the polarization rotator 502.

The polarization rotator 502 may be formed from a variety of optical components. In some embodiments, as illustrated in FIGS. 5 through 8B, a polarization rotator 502 is formed from a segmented half-wave plate. In this regard, the polarization rotator 502 may include two or more half-wave plates distributed across the pupil plane 126, each having an optic axis oriented in a selected direction to provide a selected spatial distribution of polarization rotation angles. In some embodiments, as illustrated in FIGS. 12 through 14B, a polarization rotator 502 includes an optically-active material having a spatially-varying thickness to provide a selected spatial distribution of polarization rotation angles. However, it is to be understood that the examples provided herein are merely illustrative and should not be interpreted as limiting.

Referring now to FIGS. 5 through 8B, a polarization rotator 502 formed from a segmented half-wave plate is described in accordance with one or more embodiments of the present disclosure.

In one embodiment, a polarization rotator 502 includes multiple segments 504 distributed throughout the pupil plane 126, where each segment 504 of the polarization rotator 502 includes a half-wave plate formed from a uniaxial crystal cut with an optic axis 506 oriented perpendicular to the propagation direction through the crystal and a thickness selected to provide a π-phase shift between orthogonal polarizations, which may have the effect of rotating the polarization of light. In particular, light polarized with an angle θ with respect to the optic axis 506 may be rotated by 2θ. In another embodiment, the optic axis 506 of the half-wave plate in each segment 504 is oriented to rotate the polarization of surface haze within the segment 504 to the selected polarization angle.

Figure 5:
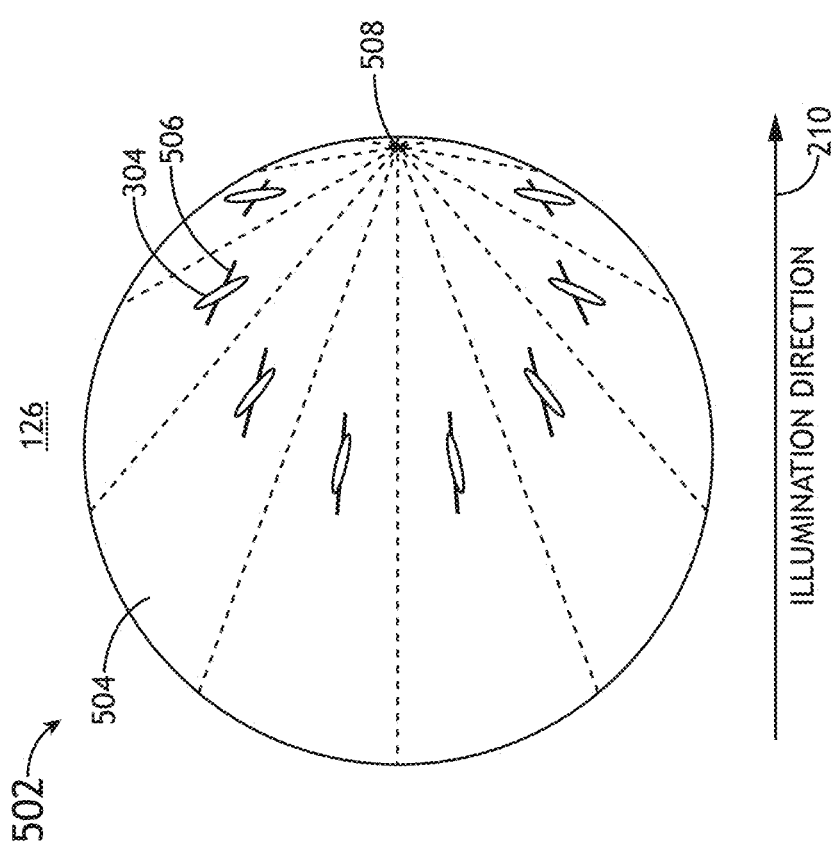
FIG. 5 is a conceptual top view of a polarization rotator formed as an angularly-segmented half-wave plate, in accordance with one or more embodiments of the present disclosure.

FIGS. 5 through 6B illustrate a polarization rotator 502 formed as an angularly-segmented half-wave plate in accordance with one or more embodiments of the present disclosure.

FIG. 5 is a conceptual top view of a polarization rotator 502 formed as an angularly-segmented half-wave plate, in accordance with one or more embodiments of the present disclosure. For example, the angularly-segmented half-wave plate illustrated in FIG. 5 may be similar to the haze-rejection polarizer 302 illustrated in FIG. 3A including half-wave plates instead of polarizers.

In one embodiment, the polarization rotator 502 includes wedge-shaped segments 504 distributed radially around an apex location 508. In another embodiment, the apex location 508 corresponds to the specular reflection angle of the illumination beam 104 from the sample 108, which may be located within or outside of the collection area 206. In this regard, each segment 504 may cover a range of radial angles in the pupil plane 126 with respect to the specular reflection angle 208 such that surface haze within each segment 504 may be substantially uniform based on the scattering map 202 in FIG. 2A.

FIGS. 6A and 6B are plots 602, 604 of orthogonally polarized portions of the collected sample light 112 after propagating through an angularly-segmented polarization rotator 502 (e.g., illustrated in FIG. 4) and a polarizing linear polarizer 122, in accordance with one or more embodiments of the present disclosure. For example, plot 602 may primarily include surface haze and plot 604 may primarily include particle scattering.

Figure 7A:
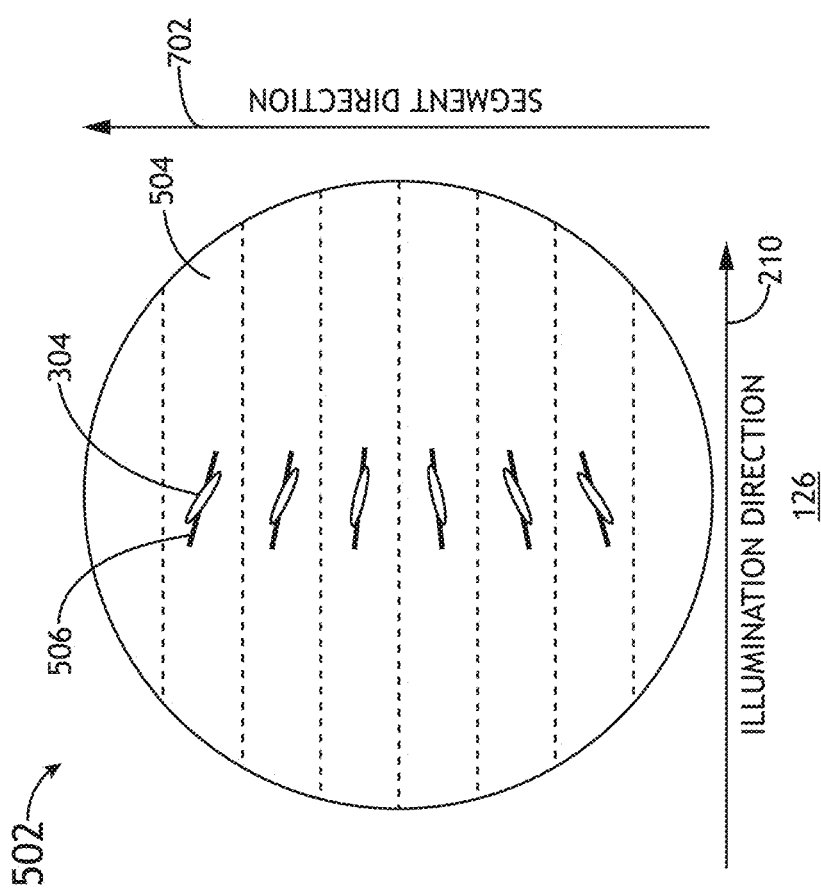
FIG. 7A is a conceptual top view of a polarization rotator formed as a linearly-segmented half-wave plate, in accordance with one or more embodiments of the present disclosure.

FIG. 7A is a conceptual top view of a polarization rotator 502 formed as a linearly-segmented half-wave plate, in accordance with one or more embodiments of the present disclosure. For example, the linearly-segmented half-wave plate illustrated in FIG. 7A may be similar to the haze-rejection polarizer 302 illustrated in FIG. 3B including half-wave plates instead of polarizers.

In one embodiment, the polarization rotator 502 includes segments 504 distributed linearly along a segmentation direction 702. For example, the segmentation direction 702 in FIG. 7A is selected to be orthogonal to the illumination direction 210 as represented in the pupil plane 126. However, it is to be understood that a polarization rotator 502 may be designed to have the segmentation direction 702 along any direction in the pupil plane 126.

Figure 7B:
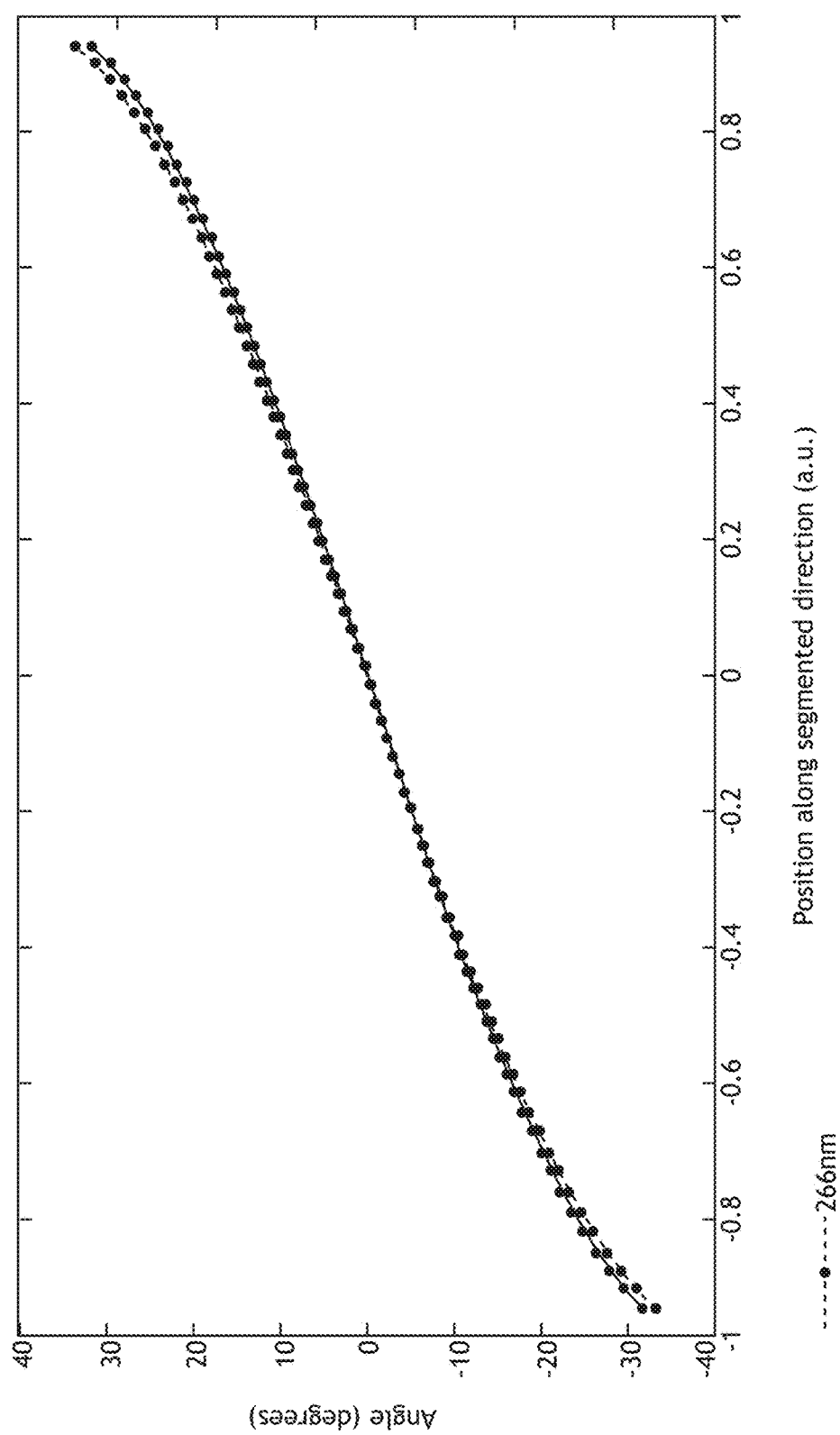
FIG. 7B is a calculated plot of the orientation directions of the optic axes of a linearly-segmented polarization rotator shown in FIG. 7A as a function of position in the pupil plane along the segmentation direction, in accordance with one or more embodiments of the present disclosure.

FIG. 7B is a calculated plot 704 of orientation directions for optic axes 506 of the linearly-segmented polarization rotator 502 shown in FIG. 7A as a function of position in the pupil plane 126 along the segmentation direction 702, in accordance with one or more embodiments of the present disclosure. In particular, FIG. 7B illustrates orientations of the optic axes 506 relative to the illumination direction 210 of the illumination beam 104 for wavelengths of 266 nm and 213 nm, respectively. Further, the plot 704 is calculated for a configuration of the particle detection system 100 including a phase mask (e.g., the phase mask 402, or the like) at or near the pupil plane 126 prior to the polarization rotator 502 to reshape the PSF of the particle-scattered light to provide constructive interference at a central portion of an imaged particle.

For example, a linearly-segmented polarization rotator 502 may be designed to include a selected number of segments 504, each occupying a range of positions along the X-axis of the plot 704. Further, the orientation angle of the optic axis 506 in each segment 504 may be selected based on the plot 704 using any selection technique known in the art. For instance, the orientation angle of the optic axis 506 in each segment 504 may be selected as the midpoint, average, or any other selection metric of the corresponding range of angles in the respective position in the pupil plane 126.

Figure 7C:
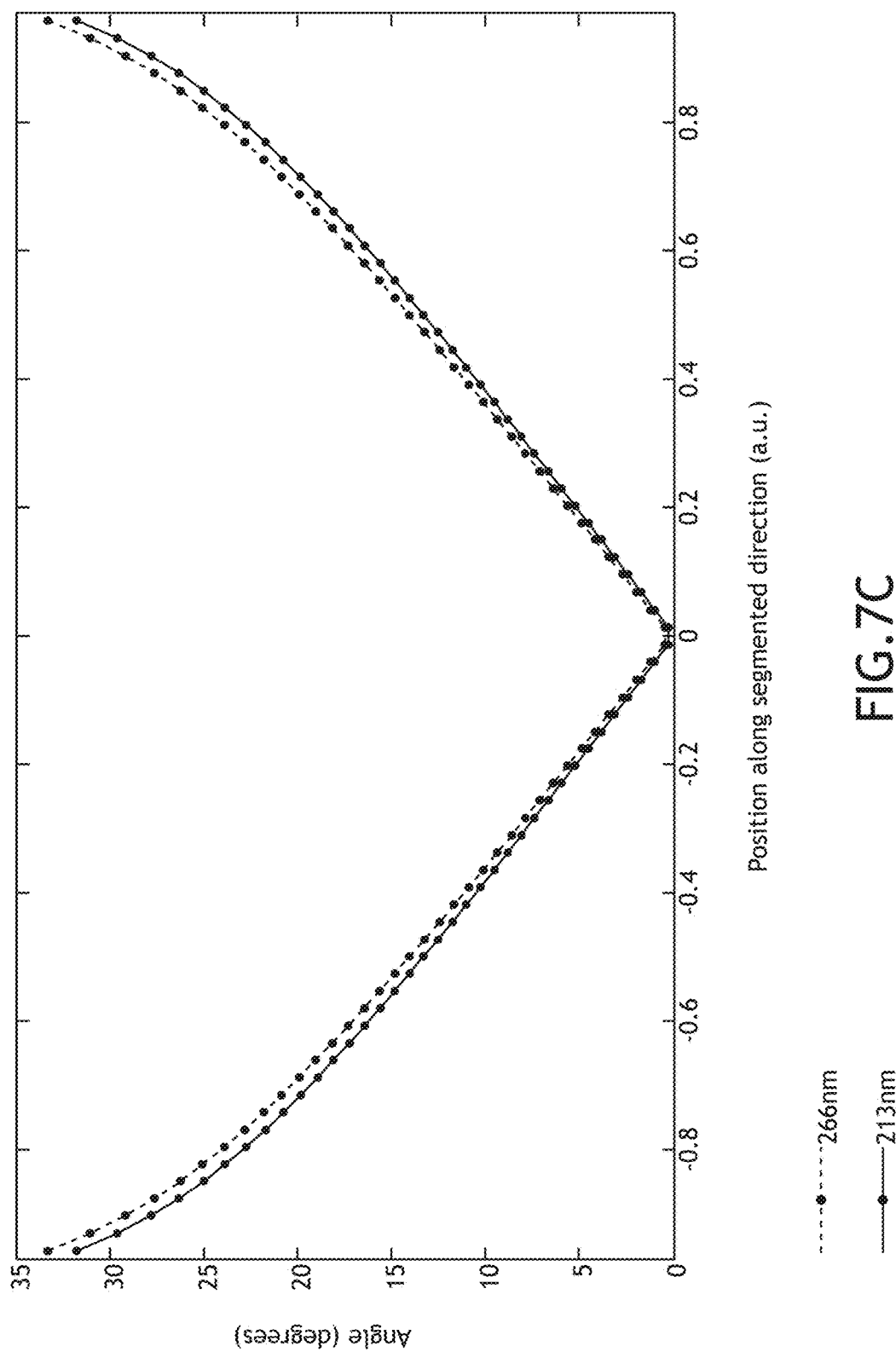
FIG. 7C is a plot of orientation directions for optic axes of a linearly-segmented polarization rotator to rotate the polarization of surface haze to a selected polarization angle, in accordance with one or more embodiments of the present disclosure.

It is to be understood, however, that the illustrations of the polarization rotator 502 in FIGS. 7A and 7B are provided solely for illustrative purposes and should not be interpreted as limiting. Rather, the polarization rotator 502 may include any number and size of segments 504 having any selected orientation of optic axes 506 to rotate the polarization of surface haze to a selected polarization angle for rejection using the linear polarizer 122. FIG. 7C is a plot 706 of orientation directions for optic axes 506 of a linearly-segmented polarization rotator 502 to rotate the polarization of surface haze to a selected polarization angle, in accordance with one or more embodiments of the present disclosure.

FIGS. 8A and 8B are plots 802, 804 of orthogonally polarized portions of the collected sample light 112 after propagating through an angularly-segmented polarization rotator 502 (e.g., illustrated in FIG. 5) and a linear polarizer 122, in accordance with one or more embodiments of the present disclosure. In this regard, plot 802 may include primarily surface haze and plot 804 may include primarily particle scattering.

As described previously herein with respect to the haze-rejection polarizer 302, it is recognized herein that the accuracy at which the optic axes 506 may map to preferentially align the polarization of surface haze across the pupil plane 126 to the selected polarization angle based on an expected electric field distribution (e.g., scattering map 202 of FIG. 2A) may vary based on the number and layout of segments 504. It is further recognized herein that the manufacturing cost of a polarization rotator 502 may also scale with complexity. Accordingly, the number and layout of segments 504 may be selected to balance various requirements including performance, manufacturing cost, and the like.

Further, in the case that the polarization ellipses 304 are not uniformly oriented in a particular segment 504, the orientation of the optic axis 506 in each segment 504 may be selected to enable rejection of surface haze according to an optimization function. For example, the optic axis 506 for each segment 504 may be selected to maximize the power of surface haze rotated to a selected polarization by the segment based on the expected distribution of intensity and/or polarization within the segment 504 (e.g., within a selected tolerance). By way of another example, the orientation of the optic axis 506 for each segment 504 may be selected to balance the power of particle scattering passed by a polarizer placed downstream of the polarization rotator 502 (e.g., linear polarizer 122) with the power of the surface haze rejected by the polarizer.

Referring now to FIGS. 9A through 9C, the use of a phase mask to reshape a point spread function (PSF) associated with images of particles smaller than an imaging resolution will be described in greater detail in accordance with one or more embodiments of the present disclosure. In particular, FIGS. 9B and 9C were generated using the phase mask 402 configured as illustrated in FIG. 4 located at or near the pupil plane 126 prior to the respective polarization rotator 502.

FIG. 9A is an image 902 of a particle smaller than a resolution of an imaging system (e.g., the particle detection system 100) generated based on scattering of obliquely-incident p-polarized light, in accordance with one or more embodiments of the present disclosure. As illustrated by FIG. 9A, the PSF of a particle based on p-polarized scattered light is annular-shaped rather than an Airy function, which is at least partly a result of the interference pattern associated with the particular polarization distribution of light in the pupil plane 126 and the use of scattered light to form the image 902. In particular, destructive interference associated with a central point 904 in FIG. 9A results in decreased intensity at the central point 904 in the image 902 and a radial shifting of the intensity outward from the central point 904. As a result, the signal strength and thus the signal to noise ratio associated with an image of a particle is negatively impacted.

FIG. 9B includes an image 906 of the particle in FIG. 9A using an imaging system (e.g., the particle detection system 100) with an angularly-segmented polarization rotator 502 as illustrated in FIG. 5 and a linear polarizer 122, in accordance with one or more embodiments of the present disclosure. In particular, the angularly-segmented polarization rotator 502 includes segments 504 having an angular width of 5°. FIG. 9C includes an image 908 of the particle in FIG. 9A using an imaging system (e.g., the particle detection system 100) with a linearly-segmented polarization rotator 502 as illustrated in FIG. 7A with 72 segments 504 and a linear polarizer 122, in accordance with one or more embodiments of the present disclosure. As illustrated in FIGS. 9A through 9C, the image of a particle generated without a phase mask as described herein has an annular shape with an intensity dip in the central point 904. However, incorporating the phase mask tightens the PSF such that an image of a particle has a central peak and a tighter distribution of intensity around the central point 904.

Figure 10:
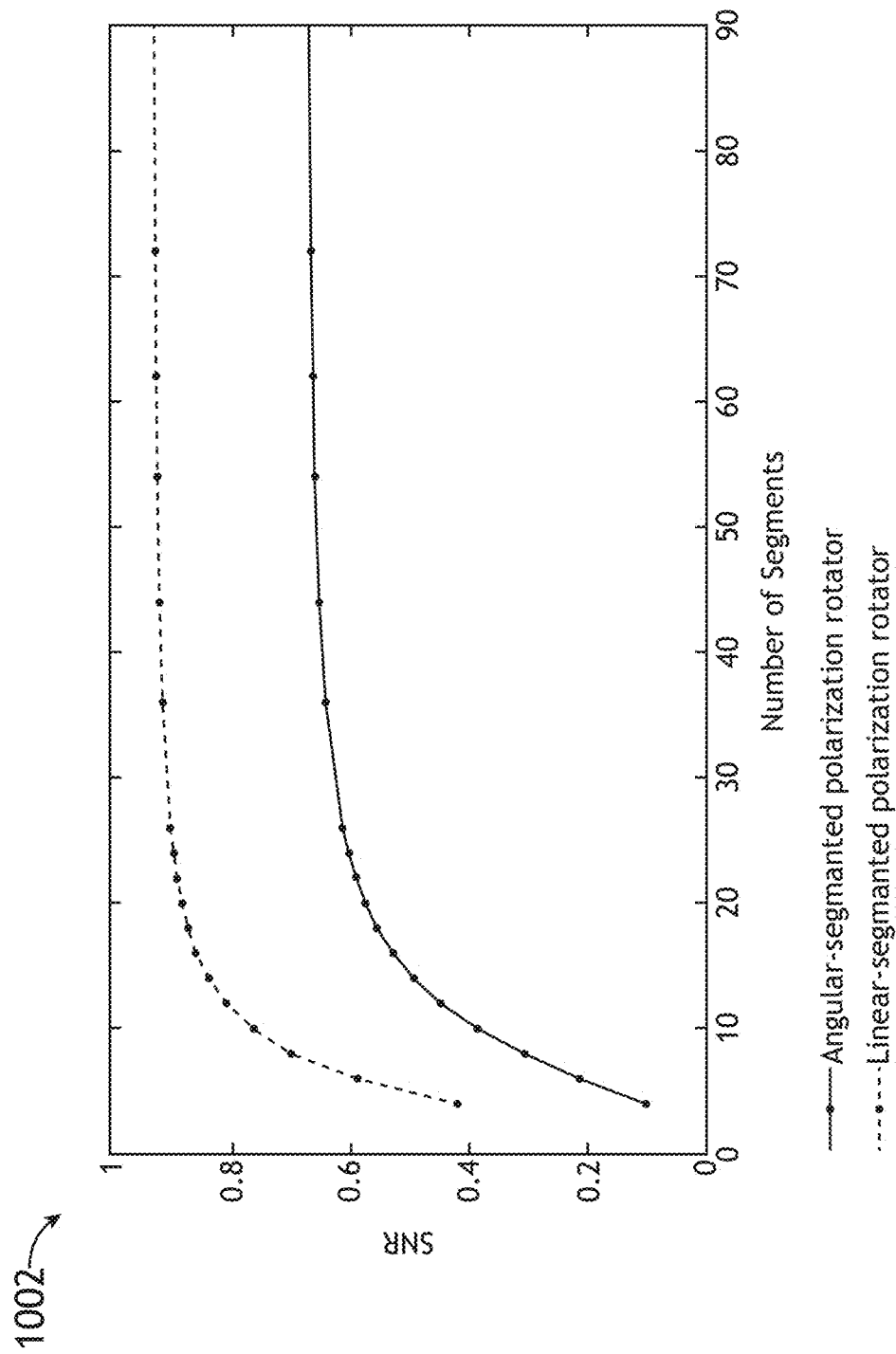
FIG. 10 is a plot illustrating the performance and convergence behavior of an angularly-segmented polarization rotator and a linearly-segmented polarization rotator, in accordance with one or more embodiments of the present disclosure.

FIG. 10 is a plot 1002 illustrating the performance and convergence behavior of an angularly-segmented polarization rotator 502 and a linearly-segmented polarization rotator 502, in accordance with one or more embodiments of the present disclosure. In particular, FIG. 10 illustrates the signal to noise ratio (SNR) of sample light 112 associated with an image of a particle with respect to background noise including, but not limited to, surface haze.

In particular, FIG. 10 corresponds to an image generated with light shown in FIG. 8B, where the illumination beam 104 is p-polarized and incident on a bare silicon wafer at an angle of 70° and the objective lens 114 has a NA of 0.97. The SNR in FIG. 10 is defined by the following formula:

$$SNR = \frac{\text{signal}}{3\sqrt{\sigma_{wafer} + \sigma_{laser} + \sigma_{shot} + \sigma_{detector}}} \qquad (1)$$

where signal is the peak signal strength associated with an image of a particle (e.g., the signal strength of the central point 904 in the case a phase plate is used to reshape the PSF), $\sigma_{wafer}$ is the wafer background noise, $\sigma_{laser}$ is the laser noise, $\sigma_{shot}$ is the shot noise, and $\sigma_{detector}$ is the readout noise of the detector 120. As shown in FIG. 10, increasing the number of segments 504 generally increases the particle detection SNR, where the SNR reaches an asymptotic limit with increasing segments 504.

Figure 11A:
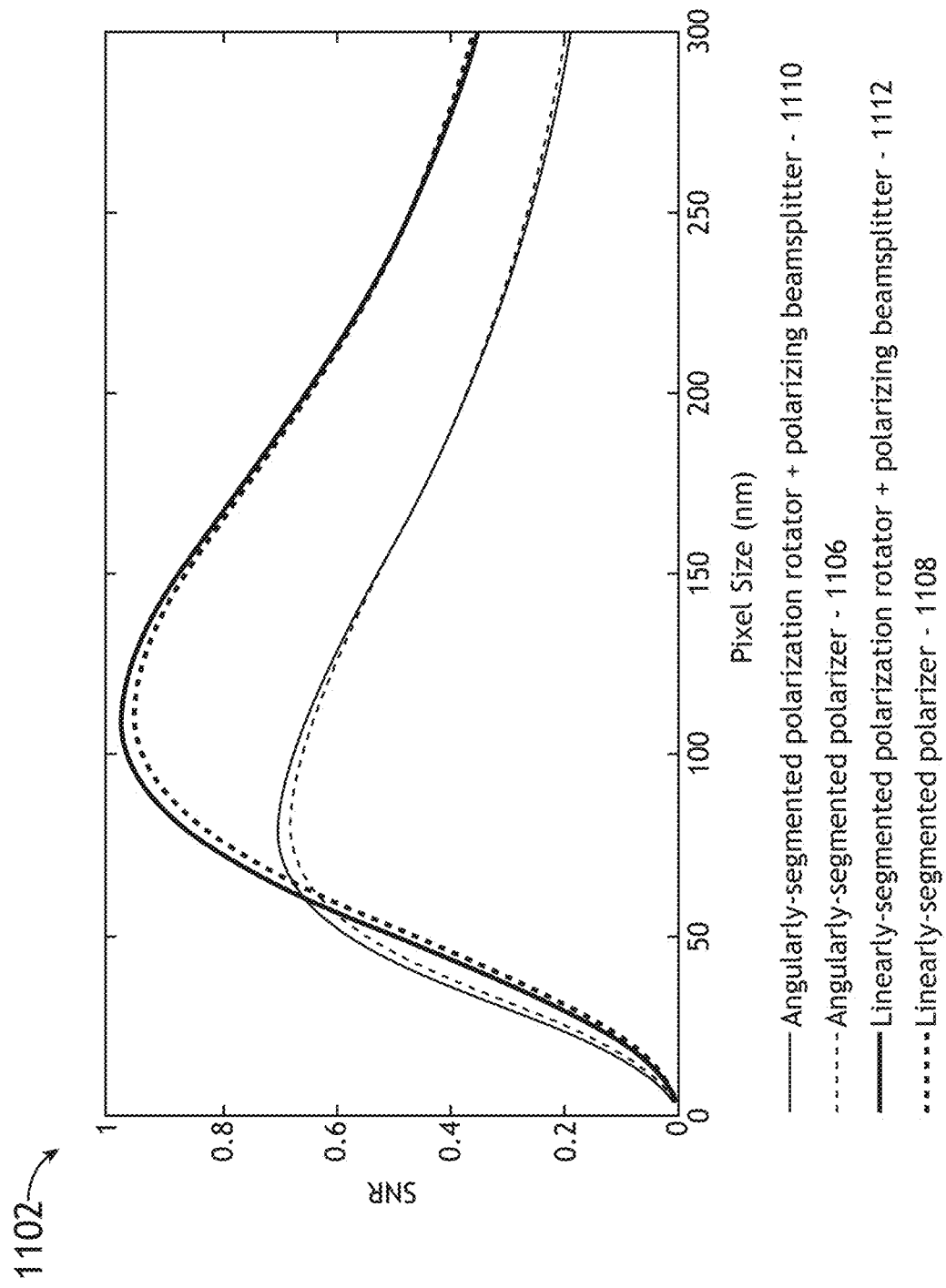
FIG. 11A is a plot of SNR as a function of pixel size for a segmented polarizer and a segmented polarization rotator using an illumination beam having a wavelength of 266 nm, in accordance with one or more embodiments of the present disclosure.
Figure 11B:
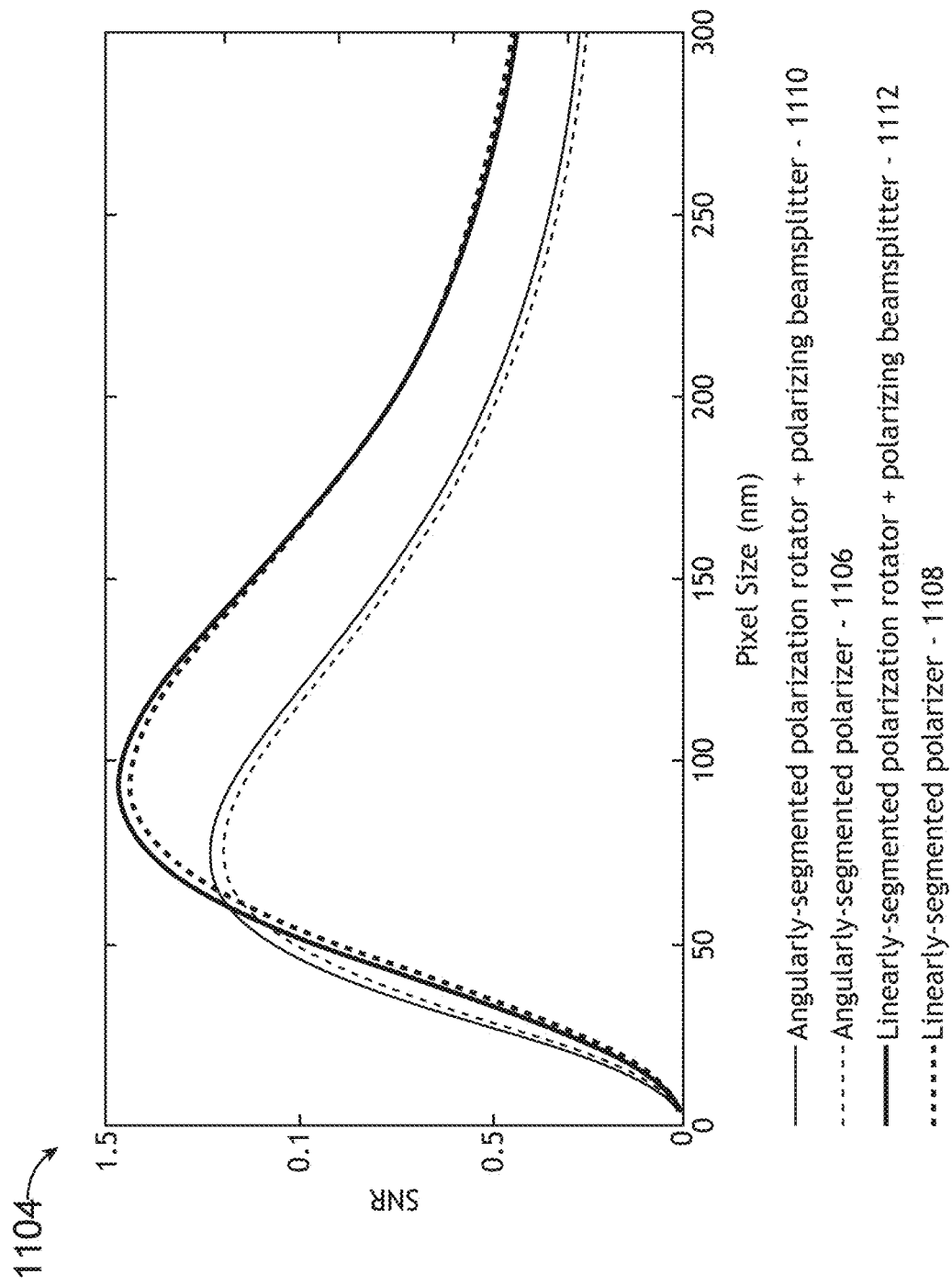
FIG. 11B is a plot of SNR as a function of pixel size for a segmented polarizer and a segmented polarization rotator using an illumination beam having a wavelength of 213 nm, in accordance with one or more embodiments of the present disclosure.

Referring now to FIGS. 11A and 11B, the performance of various configurations of a haze-rejection polarizer 302 and a segmented polarization rotator 502 are compared. FIG. 11A is a plot 1102 of SNR as a function of pixel size (e.g., of the detector 120) for various configurations of a haze-rejection polarizer 302 and a segmented polarization rotator 502 using an illumination beam 104 with a wavelength of 266 nm, in accordance with one or more embodiments of the present disclosure. FIG. 11B is a plot 1104 of SNR as a function of pixel size (e.g., of the detector 120) for various configurations of a haze-rejection polarizer 302 and a segmented polarization rotator 502 using an illumination beam 104 with a wavelength of 213 nm, in accordance with one or more embodiments of the present disclosure.

In particular, FIGS. 11A and 11B illustrate the SNR 1106 of an angularly-haze-rejection polarizer 302 (e.g., as illustrated in FIG. 3A), SNR 1108 of a linearly-haze-rejection polarizer 302 (e.g., as illustrated in FIG. 3B), SNR 1110 of an angularly-segmented polarization rotator 502 (e.g., as illustrated in FIG. 4) plus a polarizing linear polarizer 122, and a SNR 1112 of a linearly-segmented polarization rotator 502 (e.g., as illustrated in FIG. 6) plus a polarizing linear polarizer 122. Further, the signals in FIGS. 10A and 10B are based on particle detection system 100 incorporating a phase plate to reshape the PSF of a p-polarized illumination beam 104 by particles as described previously herein.

In FIGS. 11A and 11B, similar performance may be achieved with angularly-segmented elements or linearly-segmented elements. For example, the SNR 1106 of the angularly-haze-rejection polarizer 302 is comparable to the SNR 1110 of the angularly-segmented polarization rotator 502 plus a polarizing linear polarizer 122. Similarly, the SNR 1108 of the linearly-haze-rejection polarizer 302 is comparable to the SNR 1112 of the linearly-segmented polarization rotator 502 plus a polarizing linear polarizer 122.

It is noted that in FIGS. 10 through 11B, the linearly-segmented elements (e.g., the linearly haze-rejection polarizer 302 and polarization rotator 502) outperforms the angularly haze-rejection polarizer 302 elements (e.g., the angularly-segmented haze-rejection polarizer 302 and polarization rotator 502), though it is to be understood that this particular result should not be interpreted as limiting. In a general sense, the performance of a particular polarization rotator 502 may depend on a wide range of factors including, but not limited to, the number and layout of segments 504, the specific orientations of the corresponding optic axes 506, the manufacturing precision, the material and surface roughness of the sample 108, the power of the illumination beam 104, and the noise of the detector 120.

Referring now to FIGS. 12 through 14B, a polarization rotator 502 formed from an optically-active material having a varying thickness is described in greater detail.

Figure 12:
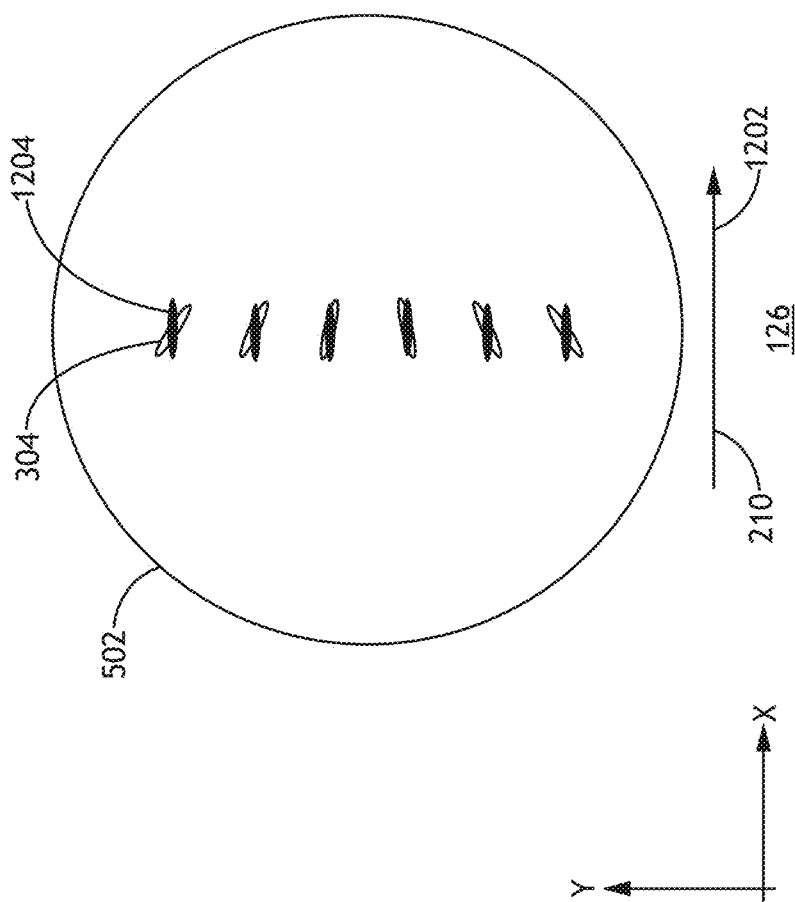
FIG. 12 is a conceptual top view of a polarization rotator formed from an optically-active material, in accordance with one or more embodiments of the present disclosure.

FIG. 12 is a conceptual top view of a polarization rotator 502 formed from an optically-active material, in accordance with one or more embodiments of the present disclosure. In one embodiment, the polarization rotator 502 is formed from an optically active material such as, but not limited to, quartz. The amount by which an optically active material rotates the polarization of light propagating through it depends on the thickness of the material. Accordingly, a thickness of the polarization rotator 502 along the propagation direction (e.g., a direction normal to the plane of FIG. 12) may vary based on location in the pupil plane 126. In this regard, light propagating through the polarization rotator 502 may exhibit a different amount of polarization rotation depending on the location of the light in the pupil plane 126 (e.g., depending on the scattering angle).

In another embodiment, a spatial distribution of the polarization rotation across the pupil plane 126 may be selected to preferentially rotate the polarization of surface haze to a selected polarization angle 1202. Accordingly, a linear polarizer 122 may separate the surface haze polarized along this selected polarization angle from the remaining light (e.g., the particle scattering), at least within a selected tolerance. For example, in FIG. 11, the polarization ellipses 304 of surface haze from the sample 108 prior to the polarization rotator 502 (open ellipses) are oriented radially with respect to the specular reflection angle 208, while the polarization ellipses 1204 of the surface haze after propagating through the polarization rotator 502 (closed ellipses) are aligned along the selected polarization angle 1202 (e.g., the X direction).

Referring now to FIGS. 13A through 14B, various designs of a polarization rotator 502 formed from an optically active material are described in accordance with one or more embodiments of the present disclosure.

It is recognized herein that the accuracy at which an optically active polarization rotator 502 may preferentially rotate the polarization of surface haze to the selected polarization angle 1202 may depend on how well the spatial distribution of the polarization rotation angle across the pupil plane 126 maps to the polarization distribution of surface haze at the pupil plane 126. It is contemplated herein that the polarization rotator 502 may provide any spatial distribution of the polarization rotation angles across the pupil plane 126. It is further contemplated herein that the manufacturing cost of the polarization rotator 502 may also scale with complexity. Accordingly, the spatial distribution of polarization rotation angles (e.g., the spatial distribution of thickness) may be selected to balance various requirements including performance, manufacturing cost, and the like.

In one embodiment, the polarization rotator 502 includes a two-dimensional spatial distribution of polarization rotation angles across the pupil plane 126. In another embodiment, the polarization rotator 502 includes a one-dimensional spatial distribution of polarization rotation angles across the pupil plane 126. In this regard, the polarization rotation angle may vary along a single selected direction in the pupil plane 126 (e.g., the Y direction of FIGS. 12 through 14B).

Figure 13A:
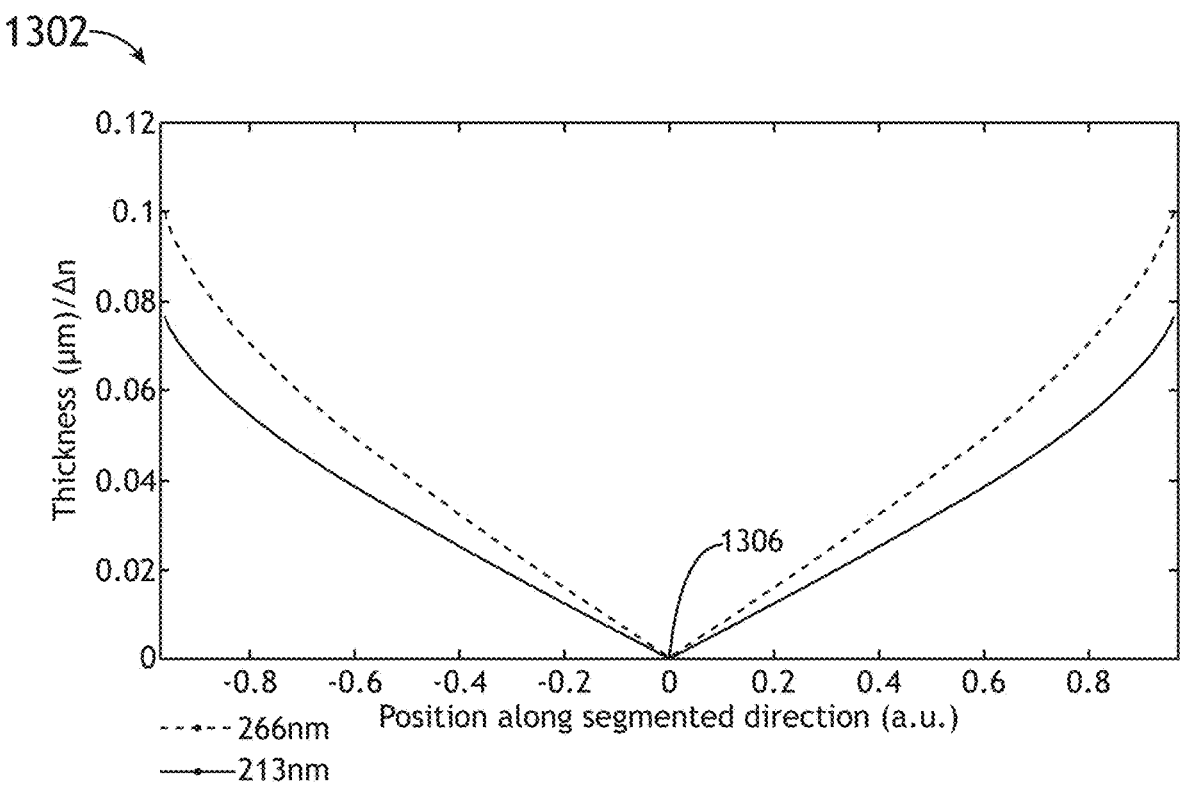
FIG. 13A is a plot of a thickness profile along the vertical direction of FIG. 12 of a polarization rotator formed from an optically active material designed to rotate the polarization of surface haze having wavelengths of 266 nm and 213 nm, respectively, to the horizontal direction in FIG. 12, in accordance with one or more embodiments of the present disclosure.

FIG. 13A is a plot 1302 of a thickness profile along the vertical direction of FIG. 12 (e.g., the Y direction) of a polarization rotator 502 formed from an optically active material designed to rotate the polarization of surface haze having wavelengths of 266 nm and 213 nm, respectively, to the horizontal direction in FIG. 12 (e.g., the X direction), in accordance with one or more embodiments of the present disclosure. In particular, FIG. 13A illustrates a symmetric design of the polarization rotator 502 about the Z axis (e.g., with respect to a position of 0 in FIG. 13A), which is intended to be used with a phase mask (e.g., phase mask 402 illustrated in FIG. 4) at or near the pupil plane 126 and prior to the polarization rotator 502 to reverse the phases of the Y polarizations in one half of the pupil plane before the light arrives at polarization rotator 502.

The thickness in FIG. 13A is provided in units of micrometers [(μm)/Δn], where Δn represents a difference between refractive index experienced by light having opposite circular polarizations through the polarization rotator 502. Further, the zero thickness represents a reference thickness according to $m\lambda/\Delta n$, where $\lambda$ is the wavelength of the illumination beam 104 and m is an arbitrary positive integer.

Figure 13B:
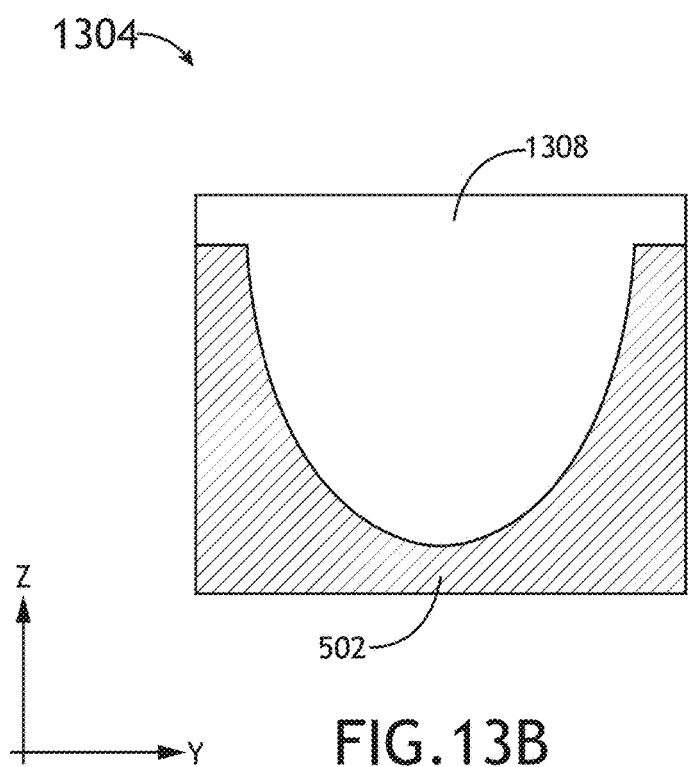
FIG. 13B is a cross-sectional view of a polarization rotator having a thickness profile based on FIG. 13A, in accordance with one or more embodiments of the present disclosure.

FIG. 13B is a cross-sectional view 1304 of a polarization rotator 502 having a thickness profile along a propagation direction (e.g., the Z direction) based on FIG. 13A, in accordance with one or more embodiments of the present disclosure. It is recognized herein that the thickness profile in FIG. 13A includes a sharp thickness transition around a central point 1306 that may be difficult to manufacture with an optically-polished surface. Accordingly, the cross-sectional view in FIG. 13B represents a deviation from the thickness profile of FIG. 13A to improve manufacturability.

In another embodiment, the particle detection system 100 includes a compensator 1308 to correct the optical path lengths of different rays so that they are approximately equal (e.g., equal across the pupil plane 126 within a selected tolerance such as, but not limited to, a phase difference of π/2). For example, the compensator 1308 may be formed from an optically-homogenous material along the propagation direction (e.g., the Z direction in FIG. 12). By way of another example, the compensator 1308 may be formed from an optically active material that has the opposite handedness to the optically active material comprising the polarization rotator 502. In one instance, the polarization rotator 502 may comprise right-handed quartz and compensator 1308 may comprise left-handed quartz, where each has a thickness profile selected such that the desired polarization rotations and phase corrections are achieved. In particular, the compensator 1308 may facilitate constructive interference of light across the pupil plane 126 when imaged on the detector 120. In this regard, the compensator 1308 may function in a similar way as the phase mask 402 described previously herein by making the path length in one half of the Y plane approximately π different from that in the other half. In one embodiment, the compensator 1308 is formed from a material having a similar refractive index to the optically active material forming the polarization rotator 502. For example, the polarization rotator 502 may be formed from crystalline quartz oriented with its optical axis in the Z direction and the compensator 1308 may be formed from fused silica.

Figure 14A:
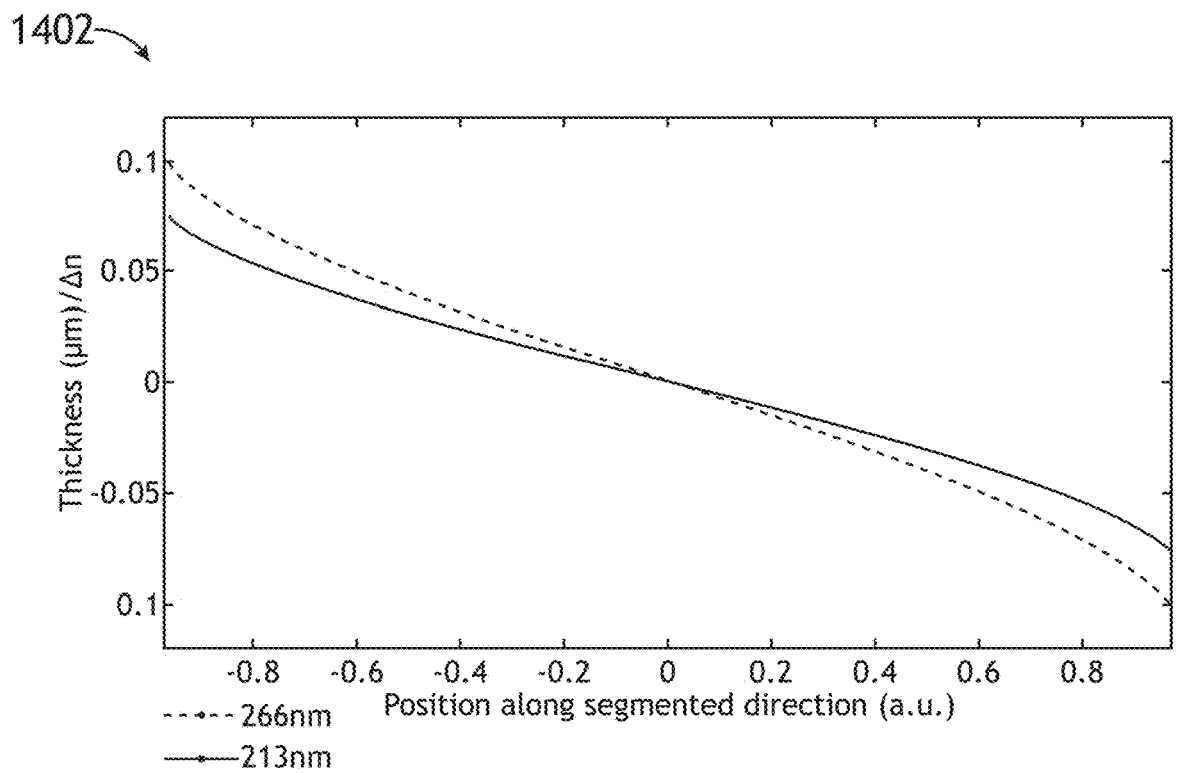
FIG. 14A is a plot of a thickness profile along the vertical direction of FIG. 12 of a polarization rotator formed from an optically active material designed to rotate the polarization of surface haze having wavelengths of 266 nm and 213 nm, respectively, to the horizontal direction in FIG. 12, in accordance with one or more embodiments of the present disclosure.

FIG. 14A is a plot 1402 of a thickness profile along the vertical direction of FIG. 12 (e.g., the Y direction) of a polarization rotator 502 formed from an optically active material designed to rotate the polarization of surface haze having wavelengths of 266 nm and 213 nm, respectively, to the horizontal direction in FIG. 12 (e.g., the X direction), in accordance with one or more embodiments of the present disclosure. Like FIG. 13A, the thickness in FIG. 14A is provided in units of micrometers [(μm)/Δn] and the zero thickness represents a reference thickness according to mλ/Δn. Further, the thickness profile of FIG. 14A does not include a sharp thickness transition as seen in the thickness profile of FIG. 13A.

Figure 14B:
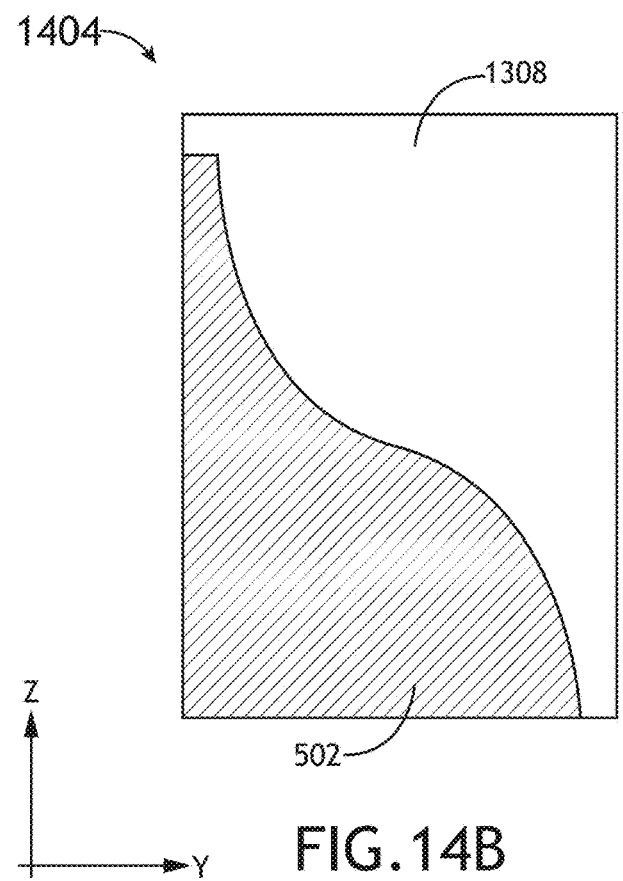
FIG. 14B is a cross-sectional view of a polarization rotator having a thickness profile based on FIG. 14A, in accordance with one or more embodiments of the present disclosure.

FIG. 14B is a cross-sectional view 1404 of a polarization rotator 502 having a thickness profile along a propagation direction (e.g., the Z direction) based on FIG. 14A and including a compensator 1308 to correct the optical path lengths of different rays so that they are approximately equal (e.g., equal across the pupil plane 126), in accordance with one or more embodiments of the present disclosure.

In another embodiment, the particle detection system 100 may include a phase mask (e.g., the phase mask 402 illustrated in FIG. 4, or the like) prior to both a polarization rotator 502 and a compensator 1308 (e.g., as illustrated in FIGS. 13B and 14B) to further reshape the PSF of images of particles generated with scattered light by facilitating constructive interference at a central portion of the particle image on the detector 120. It is further contemplated herein that some designs of an optically-active polarization rotator 502 operate to provide constructive interference of light across the pupil plane 126 when imaged on the detector 120 such that a compensator 1308 is not necessary to provide a desired PSF for particle scattering.

Figure 15:
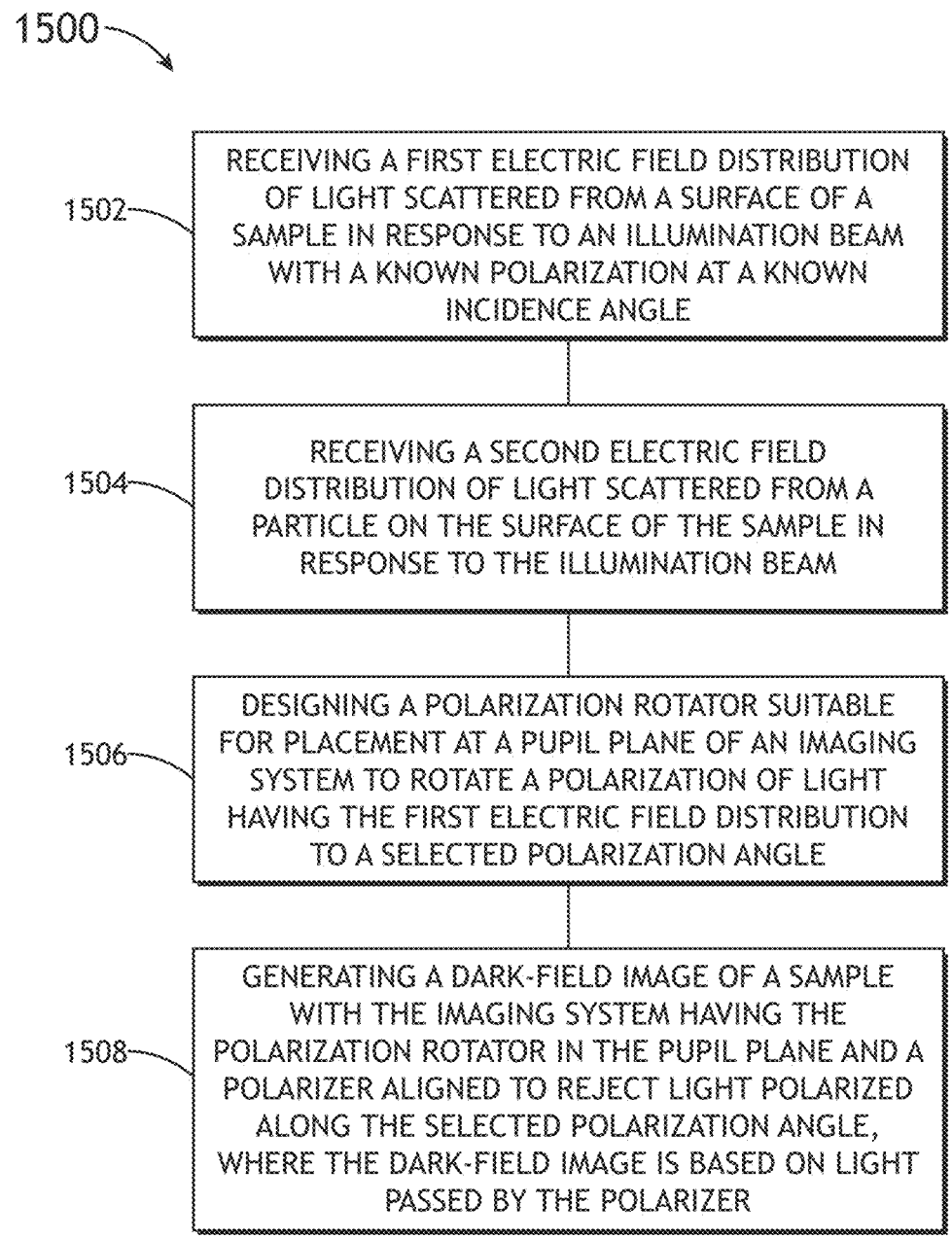
FIG. 15 is a flow diagram illustrating steps performed in a method for particle detection, in accordance with one or more embodiments of the present disclosure.

FIG. 15 is a flow diagram illustrating steps performed in a method 1500 for particle detection, in accordance with one or more embodiments of the present disclosure. Applicant notes that the embodiments and enabling technologies described previously herein in the context of the particle detection system 100 should be interpreted to extend to method 1500. It is further noted, however, that the method 1500 is not limited to the architecture of the particle detection system 100.

In one embodiment, the method 1500 includes a step 1502 of receiving a first electric field distribution of light scattered from a surface of a sample (e.g., surface haze) in response to an illumination beam with a known polarization at a known incidence angle. In another embodiment, the method 1500 includes a step 1504 of receiving a second electric field distribution of light scattered from a particle on the surface of the sample in response to the illumination beam.

In another embodiment, the method 1500 includes a step 1506 of designing a polarization rotator suitable for placement at a pupil plane of an imaging system to rotate a polarization of light having the first electric field distribution to a selected polarization angle. For example, a polarization rotation angle of light passing through the polarization rotator may be selected to vary across the pupil plane according to a spatial distribution that is selected to rotate the polarization of light having the first electric field distribution to the selected polarization angle.

For example, it may be the case that surface haze may have a different electric field distribution in a pupil plane of an imaging system than light scattered by particles on the surface. In particular, it is recognized herein that surface haze and particle scattering have substantially different electric field distributions when scattered by obliquely-incident p-polarized light.

It is contemplated herein that a polarization rotator designed in step 1506 may be formed from a variety of materials. In one embodiment, the polarization rotator includes a segmented half-wave plate formed from multiple half-wave plates distributed across the pupil plane having optic axes selectively oriented to rotate surface haze in the respective portions of the pupil plane to the first polarization angle. In another embodiment, the polarization rotator includes an optically active material such as, but not limited to, quartz having a spatially-varying thickness profile. For example, polarization rotation of light in an optically active material depends on the thickness of the optically active material. Accordingly, a polarization rotator having a spatially-varying thickness profile may provide different polarization rotation angles for light across the pupil plane.

In another embodiment, the method 1500 includes a step 1508 of generating a dark-field image of a sample with the imaging system having the polarization rotator in the pupil plane and a polarizer aligned to reject light polarized along the selected polarization angle, where the dark-field image is based on light passed by the polarizer. For example, the light passed by the polarizer may correspond to light scattered by one or more particles on the surface of the sample within a selected tolerance.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
an illumination source configured to generate an illumination beam;
one or more illumination optics to direct the illumination beam to a sample at an off-axis angle along an illumination direction;
one or more collection optics to collect scattered light from the sample in response to the illumination beam in a dark-field mode;
a polarization rotator located at a pupil plane of the one or more collection optics, wherein the polarization rotator provides a spatially-varying polarization rotation angle selected to rotate light scattered from a surface of the sample to a selected polarization angle, wherein the polarization rotator includes an angularly-segmented half-wave plate including a plurality of segments having edges oriented to intersect at an apex point in the pupil plane, wherein the apex point corresponds to specular reflection of the illumination beam in the pupil plane;
a polarizer aligned to reject light polarized along the selected polarization angle; and
a detector to generate a dark-field image of the sample based on the light passed by the polarizer, wherein the light passed by the polarizer includes at least a portion of light scattered by one or more particles on the surface of the sample.

2. The system of claim 1, wherein the one or more illumination optics are configured to direct the illumination beam to the sample with a p-polarization.

3. The system of claim 1, wherein the polarizer comprises:
a polarizing beamsplitter, wherein the polarizing beamsplitter directs the scattered light from the sample passed by the polarizer along a first optical path, wherein the polarizing beamsplitter directs the scattered light from the sample rejected by the polarizer along a second optical path different than the first optical path.

4. The system of claim 3, further comprising:
an additional detector configured to generate a dark-field image of the sample based on the scattered light from the sample rejected by the polarizer along the second optical path, wherein the scattered light from the sample rejected by the polarizer includes light scattered by the surface of the sample within a selected rejection tolerance.

5. The system of claim 1, wherein the light scattered from the surface of the sample has a known electric field distribution, wherein the polarization rotator is configured to rotate light polarized with the known electric field distribution to the selected polarization angle.

6. The system of claim 1, wherein a location of the apex point in the pupil plane is outside a collection area associated with light collected by the one or more collection optics.

7. The system of claim 1, wherein a location of the apex point in the pupil plane is inside a collection area associated with light collected by the one or more collection optics.

8. An apparatus comprising:
a polarization rotator located at a pupil plane of a dark-field imaging system, wherein the dark-field imaging system includes one or more collection optics to collect scattered light from a sample in response to off-axis illumination, wherein the polarization rotator provides a spatially-varying polarization rotation angle selected to rotate light scattered from a surface of the sample to a selected polarization angle, wherein the polarization rotator includes an angularly-segmented half-wave plate including a plurality of segments having edges oriented to intersect at an apex point in the pupil plane, wherein the apex point corresponds to specular reflection of the illumination beam in the pupil plane.

9. The apparatus of claim 8, wherein the polarization rotator is configured to be coupled with a polarizer aligned to reject light polarized along the selected polarization angle to reject the light scattered from a surface of the sample.

10. The apparatus of claim 8, wherein the light scattered from the surface of the sample has a known electric field distribution, wherein the polarization rotator is configured to rotate light polarized with the known electric field distribution to the selected polarization angle.

11. The apparatus of claim 8, wherein the apparatus further comprises:
the polarization rotator aligned to reject light polarized along the selected polarization angle to reject the light scattered from a surface of the sample.

12. A method comprising:
receiving an electric field distribution of light scattered from a surface of a sample in response to an illumination beam with a known polarization at a known incidence angle;
designing a polarization rotator suitable for placement at a pupil plane of an imaging system to provide a spatially-varying polarization rotation angle selected to rotate a polarization of light having the electric field distribution to a selected polarization angle, wherein the polarization rotator includes an optically-active material with an optic axis oriented perpendicular to the pupil plane that rotates a polarization of light in the pupil plane based on optical activity, wherein the optically-active material has a spatially-varying thickness across the pupil plane based on the electric field distribution to rotate the light scattered from the surface of the sample to the selected polarization angle; and
generating a dark-field image of a sample with the imaging system having the polarization rotator in the pupil plane and a linear polarizer aligned to reject light polarized along the selected polarization angle, wherein the dark-field image is based on light passed by the polarizer.

13. The method of claim 12, wherein the known polarization is p-polarization.

14. The method of claim 12, further comprising:
receiving an electric field distribution of light scattered from a particle on the surface of the sample in response to the illumination beam, wherein designing the polarization rotator further comprises:
choosing the selected polarization angle such that at least a selected percentage of light having the electric field distribution is passed by the linear polarizer.

15. The method of claim 12, further comprising:
generating an additional dark-field image of the sample based on light polarized along the selected polarization angle that is rejected by the linear polarizer.

16. A system comprising:
an illumination source configured to generate an illumination beam;
one or more illumination optics configured to direct the illumination beam to a sample at an off-axis angle along an illumination direction;
a detector;
one or more collection optics configured to generate a dark-field image of the sample on the detector based on light collected from the sample in response to the illumination beam; and
a linearly-segmented polarizer including a plurality of segments distributed in a pupil plane of the one or more collection optics along a segmentation direction, wherein a rejection axis of each segment is oriented to reject light scattered from a surface of the sample within the segment.

17. The system of claim 16, wherein the rejection axis of each segment is oriented to reject the light scattered from a surface of the sample within the segment based on a known electric field distribution of light scattered from the surface of a sample in response to illumination with a known polarization at a known incidence angle.

18. The system of claim 17, wherein the known polarization is p-polarization.

19. The system of claim 16, wherein the plurality of segments are linearly distributed along a direction perpendicular to the illumination direction.

20. A system comprising:
an illumination source configured to generate an illumination beam;
one or more illumination optics to direct the illumination beam to a sample at an off-axis angle along an illumination direction;
one or more collection optics to collect scattered light from the sample in response to the illumination beam in a dark-field mode;
a polarization rotator located at a pupil plane of the one or more collection optics, wherein the polarization rotator provides a spatially-varying polarization rotation angle selected to rotate light scattered from a surface of the sample to a selected polarization angle, wherein the polarization rotator includes an optically-active material with an optic axis oriented perpendicular to the pupil plane that rotates a polarization of light in the pupil plane based on optical activity, wherein the optically-active material has a spatially-varying thickness across the pupil plane to rotate the light scattered from the surface of the sample to the selected polarization angle;
a polarizer aligned to reject light polarized along the selected polarization angle; and
a detector to generate a dark-field image of the sample based on light passed by the polarizer, wherein the light passed by the polarizer includes at least a portion of light scattered by one or more particles on the surface of the sample.

21. The system of claim 20, wherein the optically-active material comprises:
an optically-active crystal having an optic axis oriented perpendicular to the pupil plane.

22. The system of claim 20, further comprising:
a phase compensator located in the pupil plane prior to the polarization rotator to equalize optical path lengths of the scattered light from the sample across the pupil plane.

23. The system of claim 22, wherein the phase compensator is formed from an optically homogenous material along a propagation direction through the phase compensator.

24. The system of claim 22, wherein the phase compensator is formed from an optically active material along a propagation direction through the phase compensator having an opposite handedness of the polarization rotator.

25. The system of claim 22, wherein the light passed by the polarizer includes at least a portion of light scattered by one or more particles on the surface of the sample.

26. The system of claim 22, wherein the light scattered from the surface of the sample has a known electric field distribution, wherein the polarization rotator is configured to rotate light polarized with the known electric field distribution to the selected polarization angle.

27. An apparatus comprising:
a polarization rotator located at a pupil plane of a dark-field imaging system, wherein the dark-field imaging system includes one or more collection optics to collect scattered light from a sample in response to off-axis illumination, wherein the polarization rotator provides a spatially-varying polarization rotation angle selected to rotate light scattered from a surface of the sample to a selected polarization angle, wherein the polarization rotator includes an optically-active material with an optic axis oriented perpendicular to the pupil plane that rotates a polarization of light in the pupil plane based on optical activity, wherein the optically-active material has a spatially-varying thickness across the pupil plane to rotate the light scattered from the surface of the sample to the selected polarization angle.

28. The system of claim 27, wherein the optically-active material comprises:
an optically-active crystal having an optic axis oriented perpendicular to the pupil plane.

29. The system of claim 27, further comprising:
a phase compensator located in the pupil plane prior to the polarization rotator to equalize optical path lengths of the scattered light from the sample across the pupil plane.

30. The system of claim 29, wherein the phase compensator is formed from an optically homogenous material along a propagation direction through the phase compensator.

31. The system of claim 29, wherein the phase compensator is formed from an optically active material along a propagation direction through the phase compensator having an opposite handedness of the polarization rotator.

* * * * *